United States Patent
Howald et al.

(10) Patent No.: US 6,838,832 B1
(45) Date of Patent: Jan. 4, 2005

(54) APPARATUS AND METHODS FOR IMPROVING THE STABILITY OF RF POWER DELIVERY TO A PLASMA LOAD

(75) Inventors: Arthur M. Howald, Pleasanton, CA (US); Andras Kuthi, Thousand Oaks, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 195 days.

(21) Appl. No.: 10/259,160

(22) Filed: Sep. 26, 2002

Related U.S. Application Data

(60) Provisional application No. 60/362,745, filed on Mar. 8, 2002.

(51) Int. Cl.[7] ............................... H01J 7/24; H01P 5/12
(52) U.S. Cl. ................................. 315/111.21; 333/81 R
(58) Field of Search ........................ 315/111.21, 111.71; 333/17.3, 32, 81 R, 99 PL; 118/725, 723 I; 204/298.08

(56) References Cited

U.S. PATENT DOCUMENTS

| | | | |
|---|---|---|---|
| 5,866,985 A | | 2/1999 | Coultas et al. |
| 6,259,334 B1 | * | 7/2001 | Howald ..................... 333/17.3 |
| 6,583,572 B2 | * | 6/2003 | Veltrop et al. .......... 315/111.51 |
| 6,646,385 B2 | * | 11/2003 | Howald et al. ......... 315/111.51 |
| 2003/0215373 A1 | * | 11/2003 | Reyzelman et al. ... 422/186.29 |

* cited by examiner

Primary Examiner—James Vannucci
Assistant Examiner—Minh Dieu A
(74) Attorney, Agent, or Firm—IP Strategy Group PC

(57) ABSTRACT

Methods for improving the stability of RF power delivery to a plasma load are disclosed. The method includes adding an RF resistor and/or a power attenuator at one of many specific locations in the RF power system to lower the impedance derivatives while keeping the matching circuit substantially in tune with the RF transmission line.

174 Claims, 24 Drawing Sheets

Fig 16

Fig. 4A
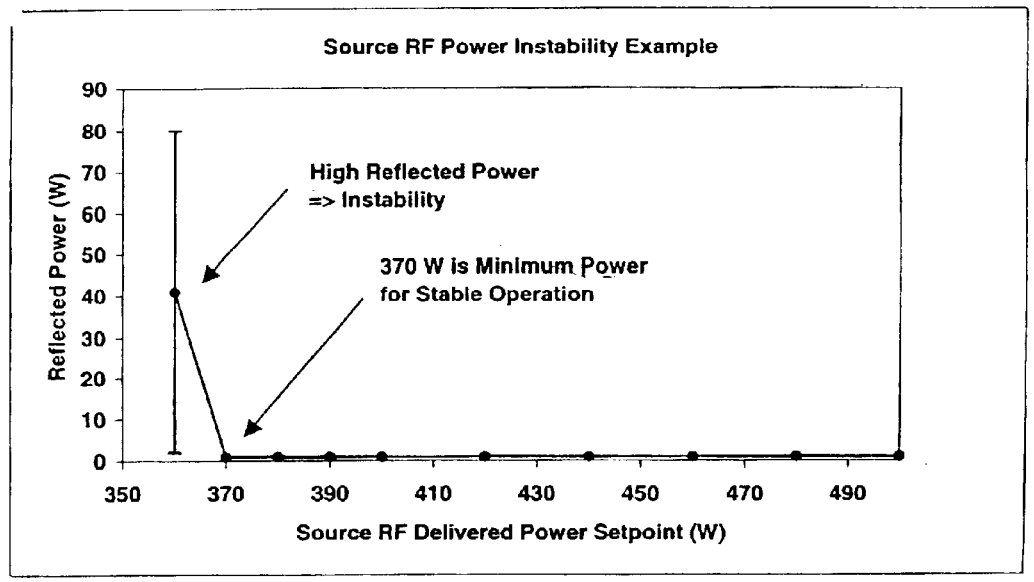
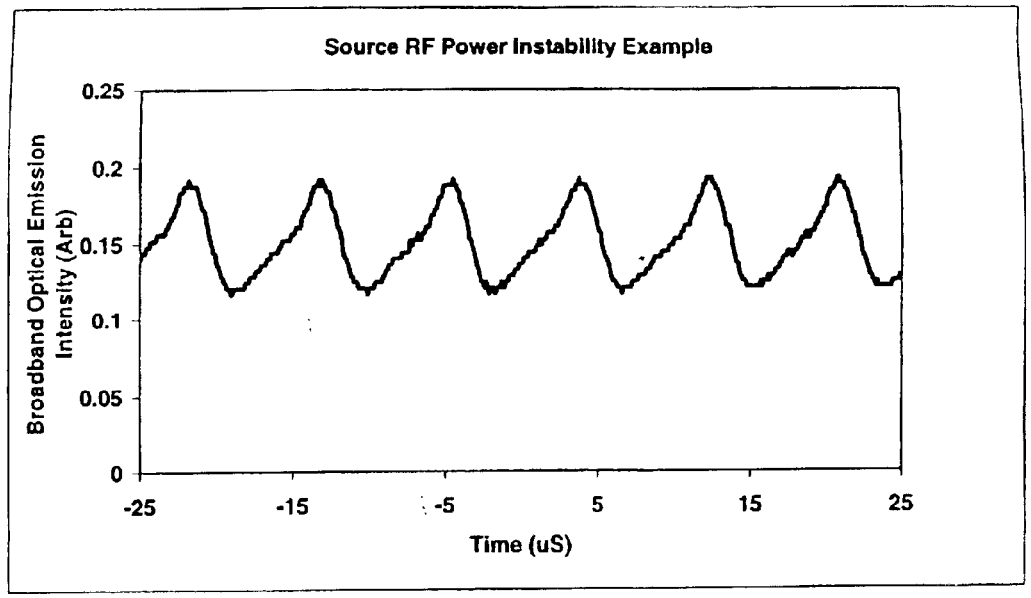
Fig. 4B

Fig. 13A
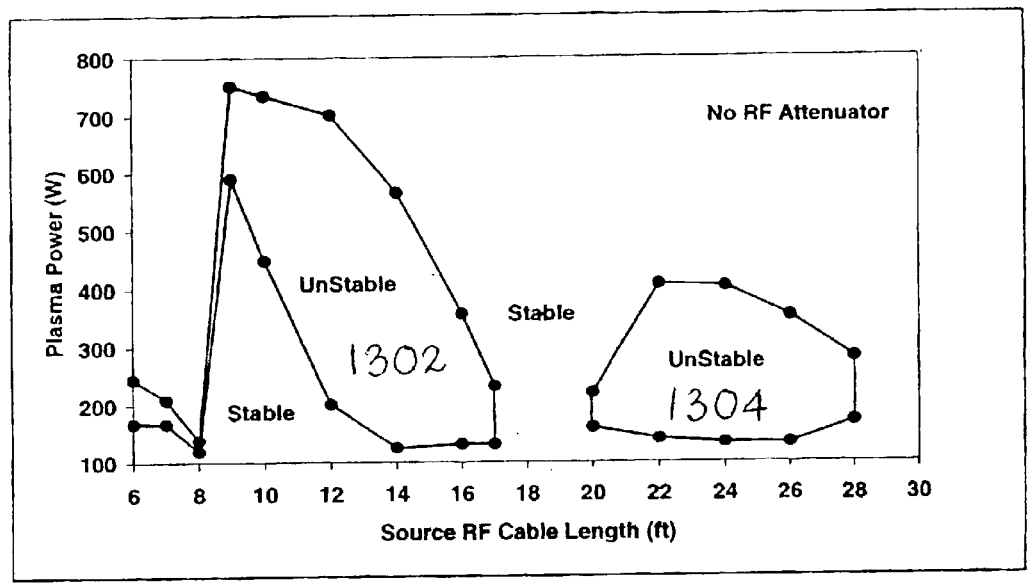
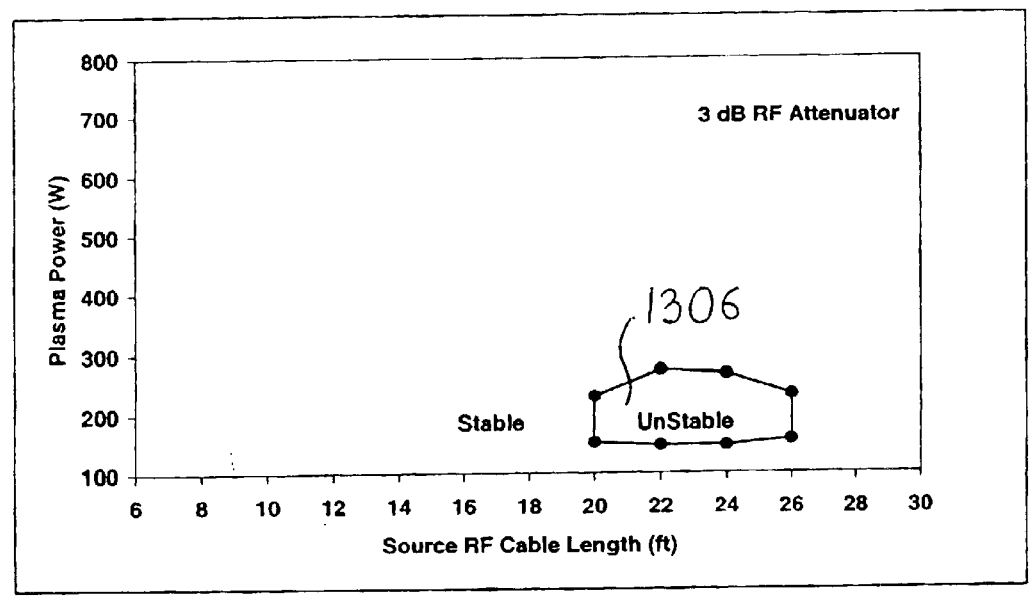
Fig. 13B

APPARATUS AND METHODS FOR IMPROVING THE STABILITY OF RF POWER DELIVERY TO A PLASMA LOAD

This application claims benefit of Provisional No. 60/362,745 filed Mar. 8, 2002.

BACKGROUND OF THE INVENTION

The present invention relates to methods and apparatus for improving the stability of RF power delivery to a plasma load in a plasma processing system.

Plasma processing systems have been around for some time. Over the years, plasma processing systems utilizing inductively coupled plasma sources, electron cyclotron resonance (ECR) sources, capacitive sources, and the like, have been introduced and employed to various degrees to process semiconductor substrates and glass panels.

During processing, multiple deposition and/or etching steps are typically employed. During deposition, materials are deposited onto a substrate surface (such as the surface of a glass panel or a wafer). For example, deposited layers comprising various forms of silicon, silicon dioxide, silicon nitride, metals and the like may be formed on the surface of the substrate. Conversely, etching may be employed to selectively remove materials from predefined areas on the substrate surface. For example, etched features such as vias, contacts, or trenches may be formed in the layers of the substrate. Note that some etch processes may utilize chemistries and/or parameters that simultaneously etch and deposit films on the plasma-facing surfaces.

The plasma can be generated and/or sustained using a variety of plasma generation methods, including inductively-coupled, ECR, microwave and capacitively-coupled plasma methods. In an inductively-coupled plasma processing chamber, for example, an inductive source is employed to generate the plasma. To facilitate discussion, FIG. 1 illustrates a prior art inductive plasma processing chamber 100, which is configured for etching in this example. Plasma processing chamber 100 includes a substantially cylindrical chamber wall portion 102 and an antenna or inductive coil 104 disposed above a dielectric window 106. Typically, antenna 104 is operatively coupled to a first radio frequency (RF) power source 108, which may include an RF generator 110 and an RF match network 112 as shown. RF generator 110 may operate at a frequency of, for example, 4 MHz. Generally speaking, the RF signals from the RF generators may be sinusoidal, pulsed, or non-sinusoidal. Dielectric window 106 is typically formed of a high resistivity dielectric material, such as high resistivity silicon carbide (SiC).

Within plasma processing chamber 100, a set of inlet gas ports (not shown) is typically provided to facilitate the introduction of gaseous source materials, e.g., the etchant source gases, into the RF-induced plasma region between dielectric window 106 and a substrate 114. Substrate 114 is introduced into chamber 100 and disposed on a chuck 116. Chuck 116 generally acts as an electrode and is operatively coupled to a second RF power source 118, which may include an RF generator 120 and an RF match network 122 as shown. RF generator 120 may operate at an RF frequency of, for example, 13.56 MHz. As mentioned, the RF signal from RF generator 120, like other RF signals from the RF generators, may be sinusoidal, pulsed, or non-sinusoidal.

In order to create a plasma, a process source gas is input into chamber 100 through the aforementioned set of inlet gas ports. Power is then supplied to inductive coil 104 using RF power source 108 and to chuck 116 using RF power source 118. The supplied RF energy from RF power source 108 coupled through dielectric window 106 excites the process source gas and a plasma 124 is generated thereby.

Chamber 100 may also be provided with different components, depending on the specific manufacturer thereof and/or the requirements of a particular process. For example, focus rings, plasma screens, magnets, pressure control rings, hot edge rings, various gas injector nozzles, probes, chamber liners, etc., may also be provided. To simplify the illustration, these well-known components are omitted from FIG. 1.

Generally speaking, it is critical to maintain tight control of the etch process in order to obtain a satisfactory etch result Thus, parameters such as the antenna RF voltage, antenna RF power, bias RF voltage, bias RF power, plasma density, the amount of contamination in the chamber, and the like, must be carefully controlled. Furthermore, it is important to maintain a tight control of the etch process over as wide a process window as possible. In this regard, the stability of the RF power delivery to the plasma load is a particularly important issue. For a given process recipe, it is crucial that the RF power delivery remain stable throughout the process to obtain a reliable process result.

This invention deals with methods and apparatus for improving the stability of the RF power delivery to the plasma in a plasma processing chamber as well as methods for quantifying parameters contributing to the stability of the RF power delivery to the plasma at a given parameter setting.

SUMMARY OF THE INVENTION

The invention relates, in one embodiment, to a method for configuring a plasma processing system. The plasma processing system is configured for processing semiconductor substrates. The method includes providing an RF power arrangement, which includes an RF generator having an RF generator output, a first RF transmission line coupled to receive RF current from the RF generator output during operation, the first RF transmission line having a characteristic impedance, a matching network having an input impedance substantially equal to the characteristic impedance of the first RF transmission line, the matching network being configured to receive the RF current from the RF generator through the first RF transmission line. The method includes coupling an RF power attenuator in a current path between the RF generator and the matching network.

In another embodiment, the invention relates to a plasma processing system, which includes an RF generator having an RF generator output. There is included a first RF transmission line coupled to receive RF current from the RF generator output, the first RF transmission line having a characteristic impedance. There is additionally included a matching network having an input impedance substantially equal to the characteristic impedance of the first RF transmission line, the matching network being configured to receive the RF current from the RF generator through the first RF transmission line. There is further included an RF power attenuator coupled in a current path between the RF generator and the matching network.

In yet another embodiment, the invention relates to a plasma processing system for processing semiconductor substrates, which includes an RF generator having an RF generator output. There is included an RF transmission line coupled to the RF generator output, the RF transmission line having a characteristic impedance. There is further included a matching circuit coupled to the RF transmission line, the matching circuit having a first resistor and a matching network, the matching network having a plurality of impedance devices, wherein the first resistor is coupled to at least one terminal of one of the plurality of impedance device, and wherein an input impedance of the matching circuit is substantially equal to the characteristic impedance of the RF transmission line.

In another embodiment, the invention relates to a plasma processing system, which includes an RF generator having an RF generator output. There is included a first RF transmission line coupled to receive RF current from the RF generator output, the RF transmission line having a characteristic impedance. There is additionally included a matching network having an input impedance substantially equal to the characteristic impedance of the RF transmission line, the matching network being configured to receive the RF current from the RF generator through the RF transmission line, wherein both the input impedance of the matching network and the characteristic impedance of the RF transmission line are substantially equal to a given value, the given value being designed to be lower than 50Ω, the RF generator being configured to deliver RF power into a load having the given value.

In yet another embodiment, the invention relates to a method for configuring a plasma processing system, the plasma processing system being configured for processing semiconductor substrates. The method includes providing an RF generator having an RF generator output. The method further includes configuring a first RF transmission line to receive RF current from the RF generator output, the RF transmission line having a characteristic impedance. The method additionally includes providing a matching network having an input impedance substantially equal to the characteristic impedance of the RF transmission line, the matching network being configured to receive the RF current from the RF generator through the RF transmission line, wherein both the input impedance of the matching network and the characteristic impedance of the RF transmission line are substantially equal to a given value, the given value being designed to be lower than 50Ω, the RF generator being configured to deliver RF power into a load having the given value.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

To facilitate discussion.

FIG. 4A is an exemplary graph showing a process that experiences source RF power delivery instability at certain source RF delivered power set points.

FIG. 4B shows the observed optical emission of the plasma when source RF delivered power becomes unstable.

Figure 5:
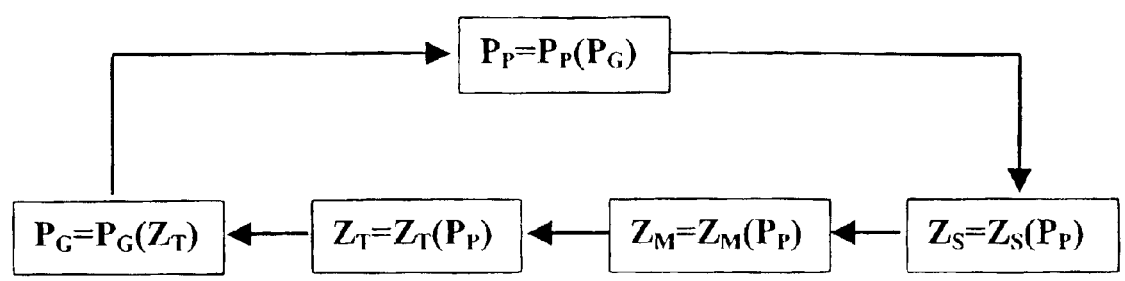

The relationship between the matching network input impedance $Z_M$, the load impedance $Z_T$, and the generator output power $P_G$ is symbolically illustrated in FIG. 5.

Figure 6:
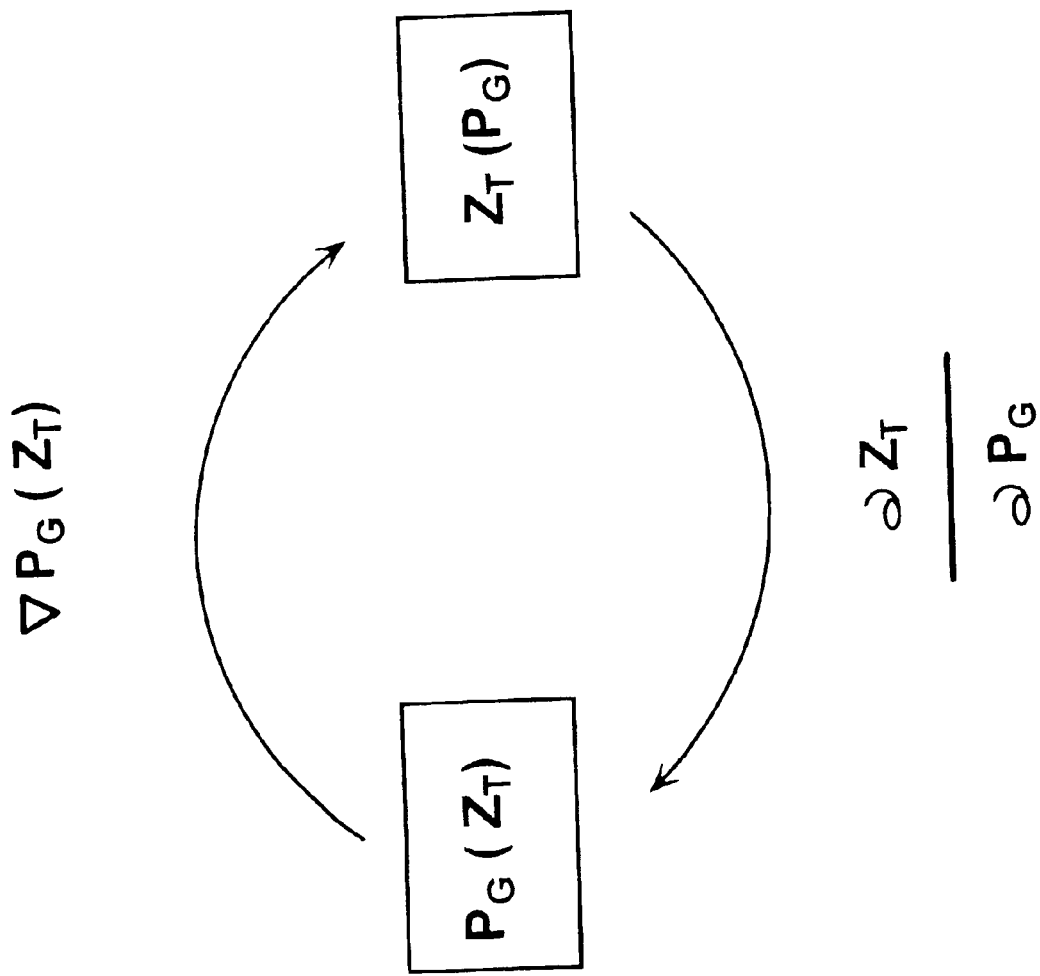

The interdependence of $Z_T$ on $P_G$ and of $P_G$ On $Z_T$ is illustrated schematically in FIG. 6, wherein $P_G$ is a real number and $Z_T$ is a complex number.

Figure 7A:
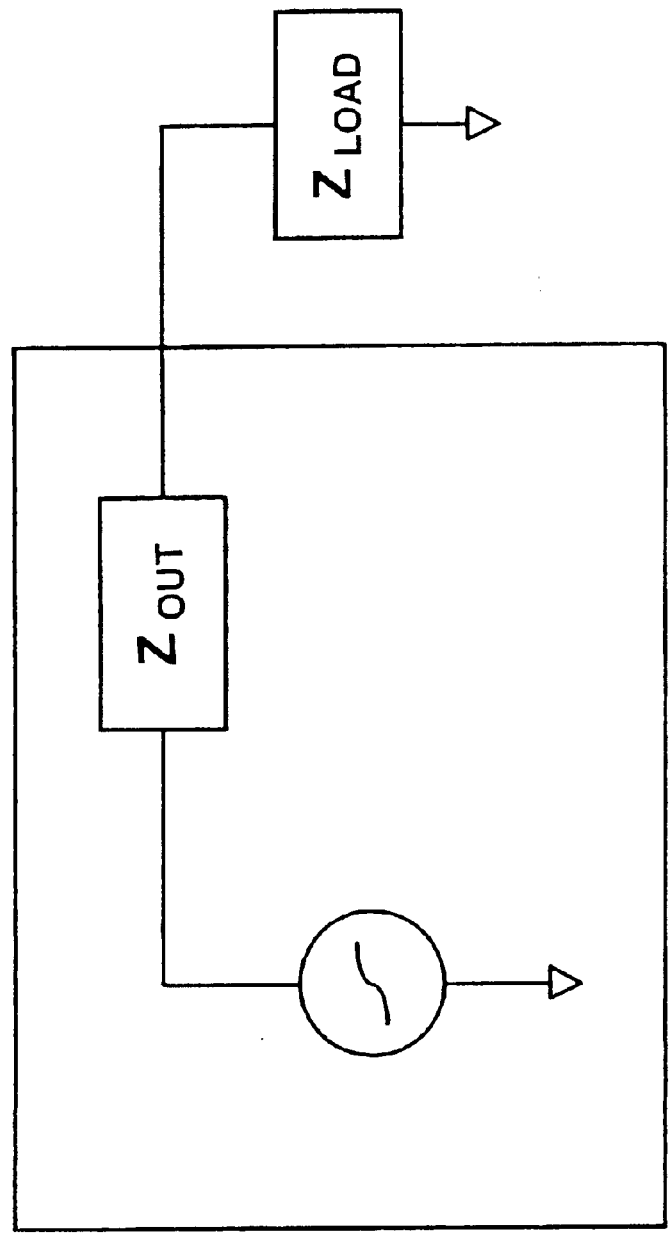

FIG. 7A models an RF generator having an RE voltage source with an output impedance $Z_{OUT}$ and load impedance $Z_{LOAD}$ in the case wherein changes in the generator load impedance occurs at time scales faster than the generator feedback control bandwidth.

Figure 7B:
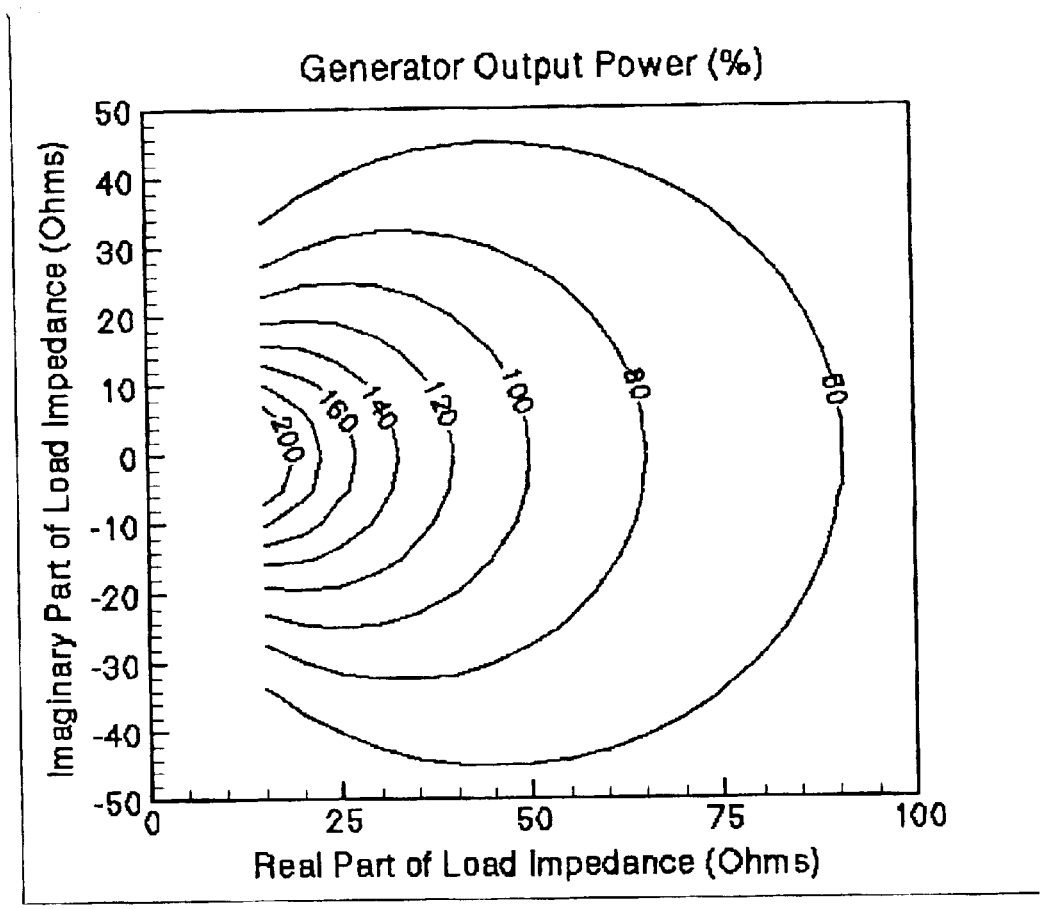

FIG. 7B shows exemplary RF power output contours as a function of load impedance $Z_{LOAD}$ for a hypothetical RF generator when changes in the load impedance $Z_{LOAD}$ occur for time scales faster than the generator feedback circuit response time.

FIGS. 8A, 8B, 8C, 8D, and 8E are exemplary circuit diagrams illustrating various embodiments of the present invention that utilize an extra resistance to reduce the impedance derivatives and to improve plasma stability.

Figure 9:
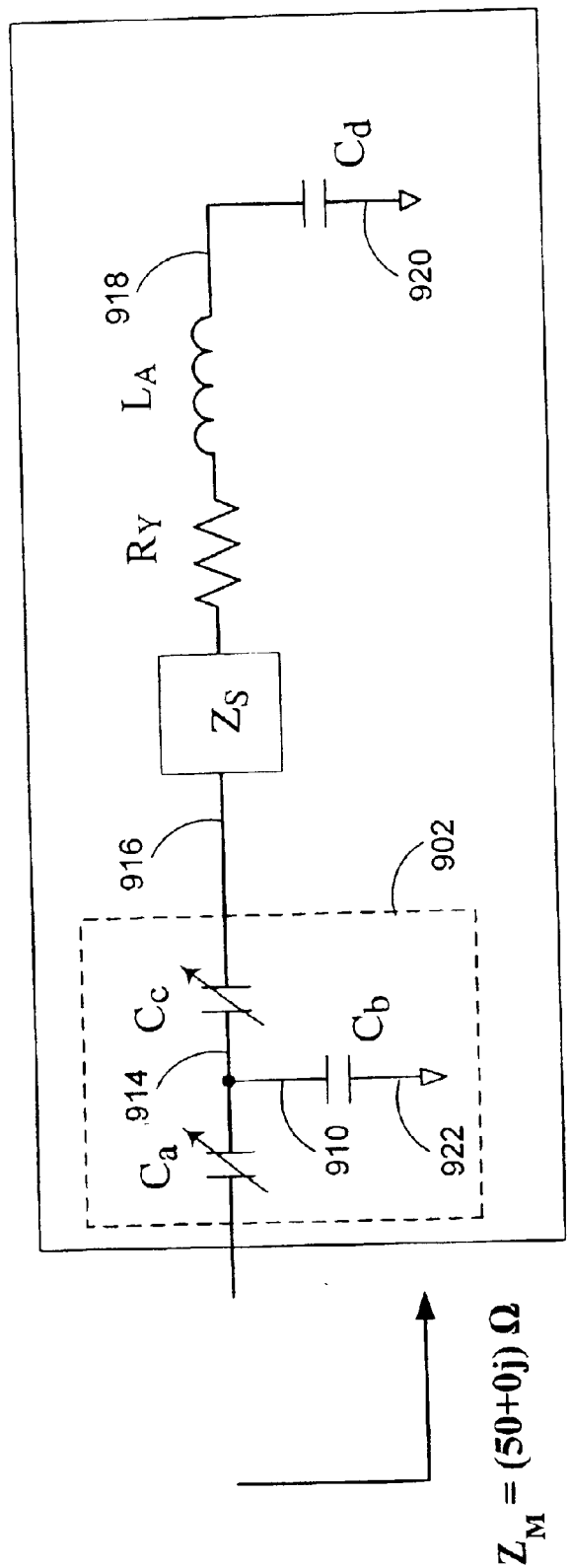

FIG. 9 shows another embodiment wherein the impedance derivatives are reduced by intentionally an extra resistance such as $R_Y$ to reduce the impedance derivatives and to improve plasma stability.

Figure 10A:
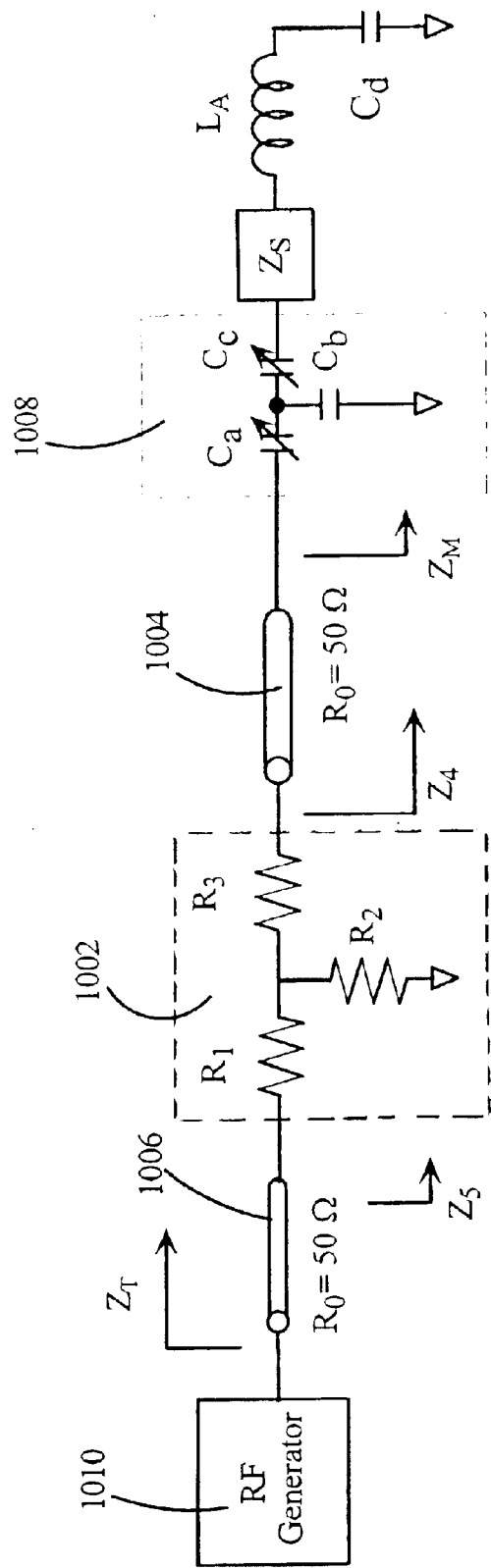

FIG. 10A shows another embodiment where the impedance derivatives are reduced by using an RF power attenuator.

Figure 10B:
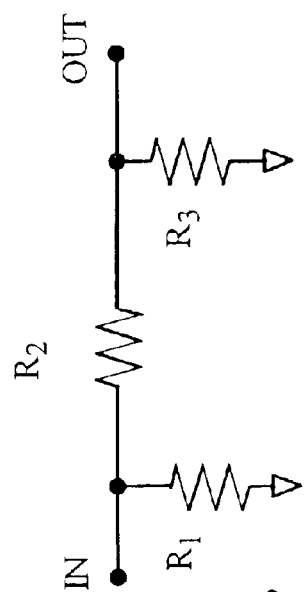

FIG. 10B shows the configuration of an exemplary Π-type RF power attenuator.

Figure 11:
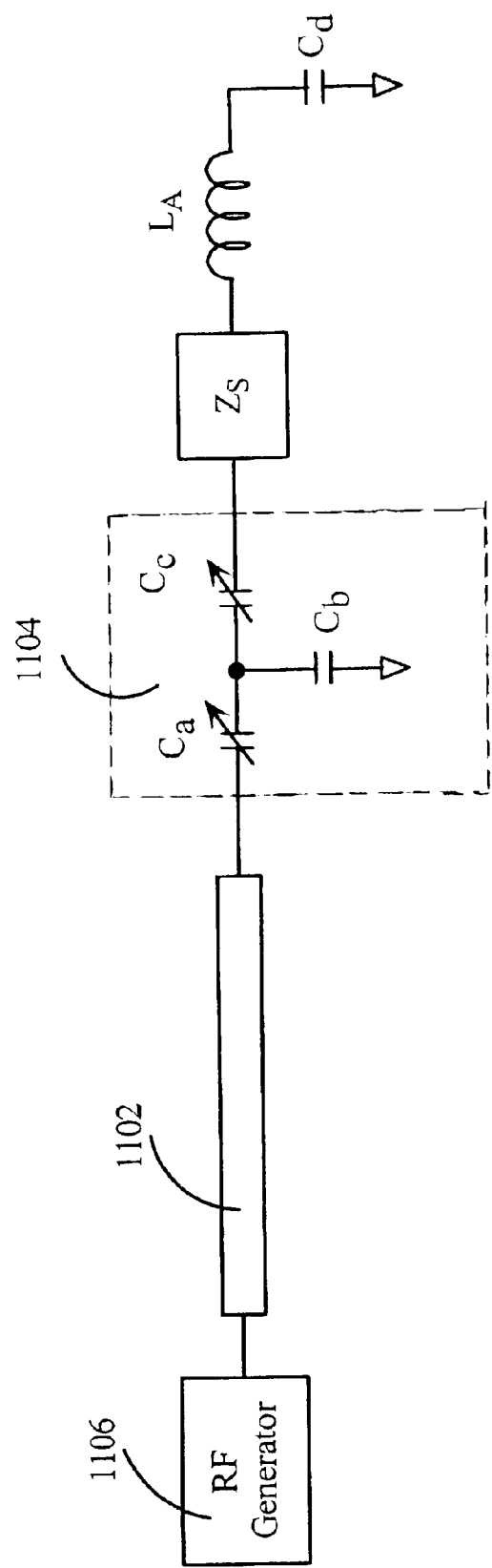

FIG. 11 shows another embodiment of the invention wherein the impedance derivatives are reduced by designing the RF transmission line to have a lower characteristic impedance $R_0$.

Figure 12:
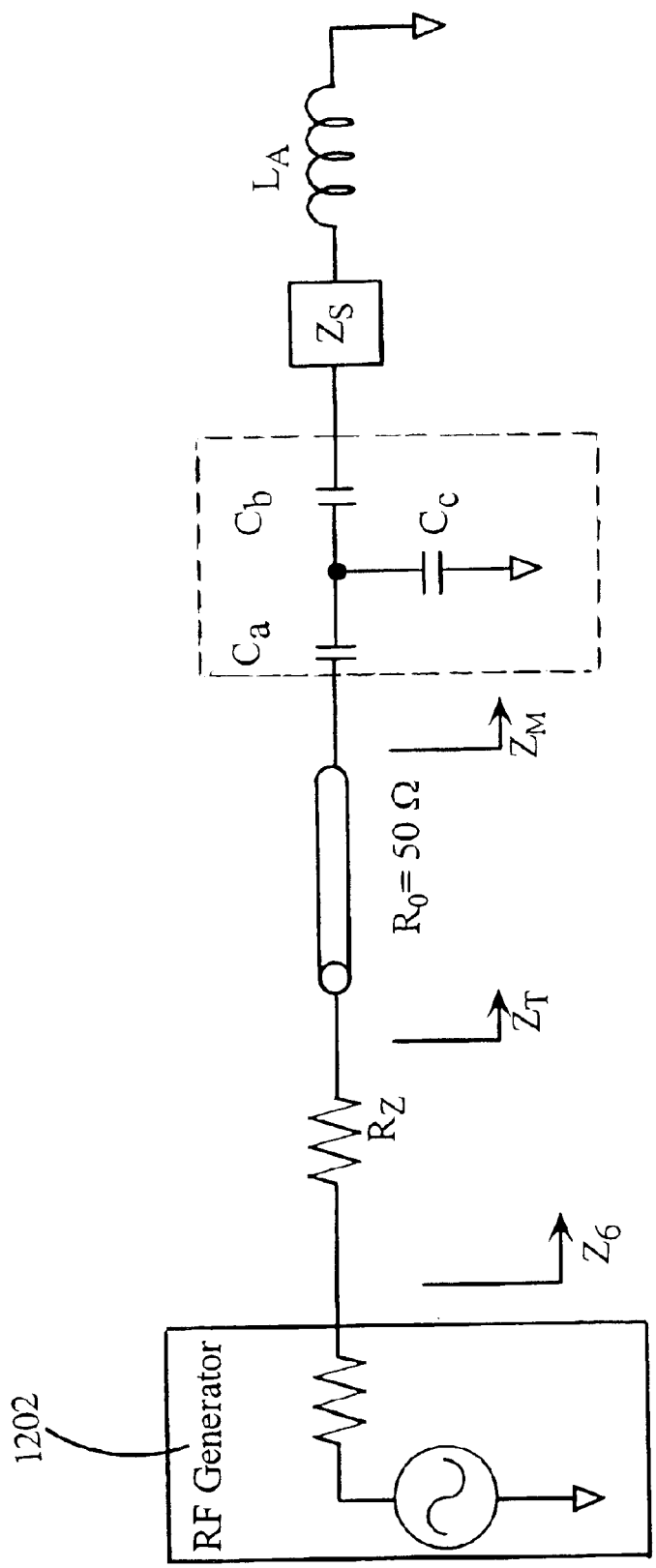

To further illustrate the non-obviousness of the invention, FIG. 12 illustrates an implementation that merely dissipates power in the additional resistor without conferring the benefit of improving RF power delivery stability.

FIGS. 13A and 13B show the effects that reducing the impedance derivative has on RF power delivery stability.

Figure 14:
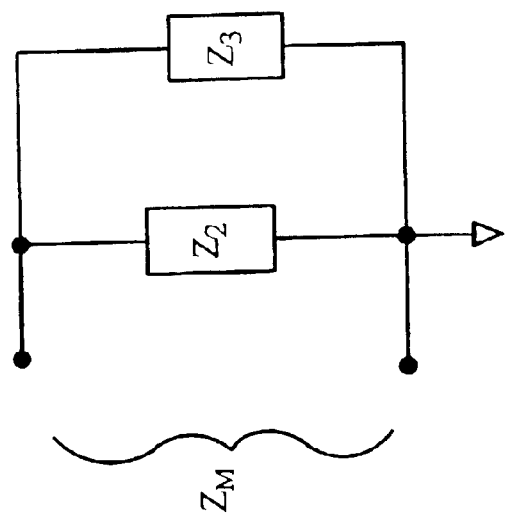

FIG. 14 shows the constituent impedances of an L-match network to facilitate the calculation of $$\frac{dZ_M}{dZ_S}.$$

Figure 15:
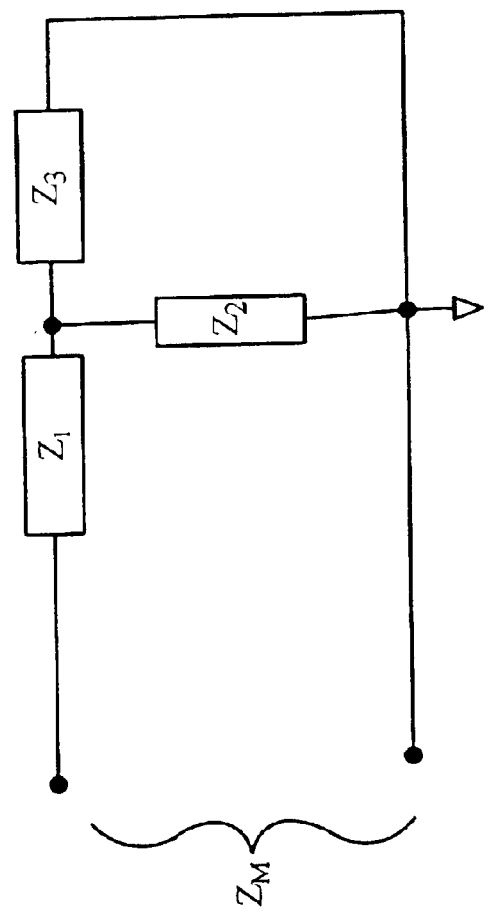

FIG. 15 shows the constituent impedances of a T-match network to facilitate the calculation of $$\frac{dZ_M}{dZ_S}.$$

Figure 16:
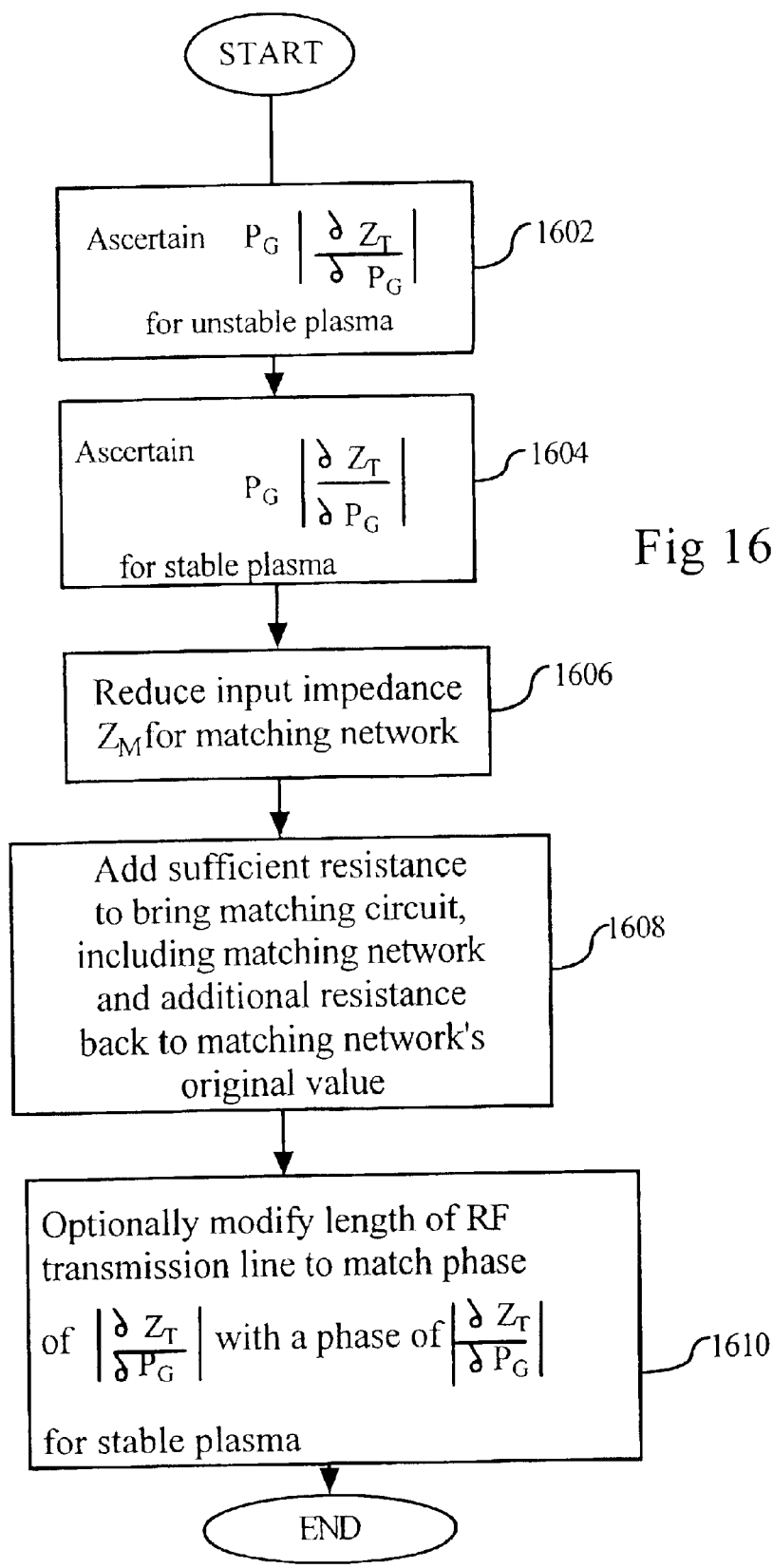

FIG. 16 illustrates, in accordance with one embodiment of the present invention, a technique for ascertaining the value of the added resistance (e.g., $R_X$ in FIG. 8a) in order to make an unstable plasma more stable.

Figure 17A:
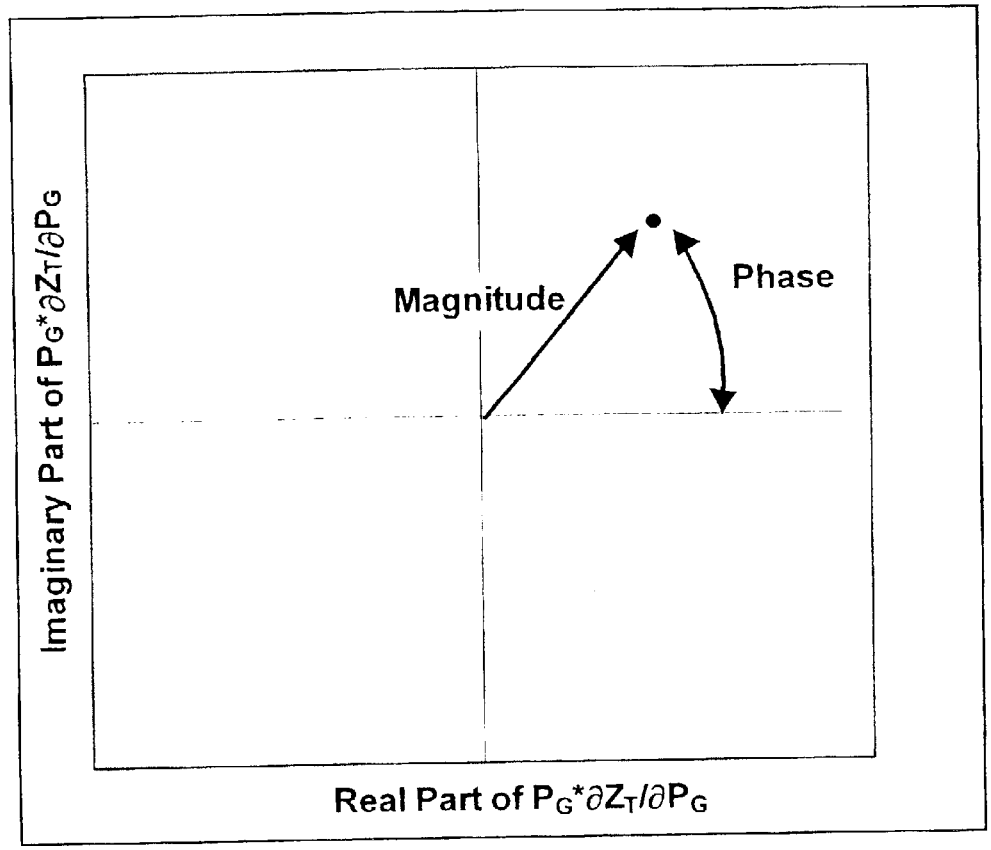

FIG. 17A represents a plasma as a plot, with the real part of $$P_G \frac{\partial Z_T}{\partial P_G}$$

being plotted along the x-axis, and the imaginary part of $$P_G \frac{\partial Z_T}{\partial P_G}$$

being plotted against the y-axis.

Figure 17B:
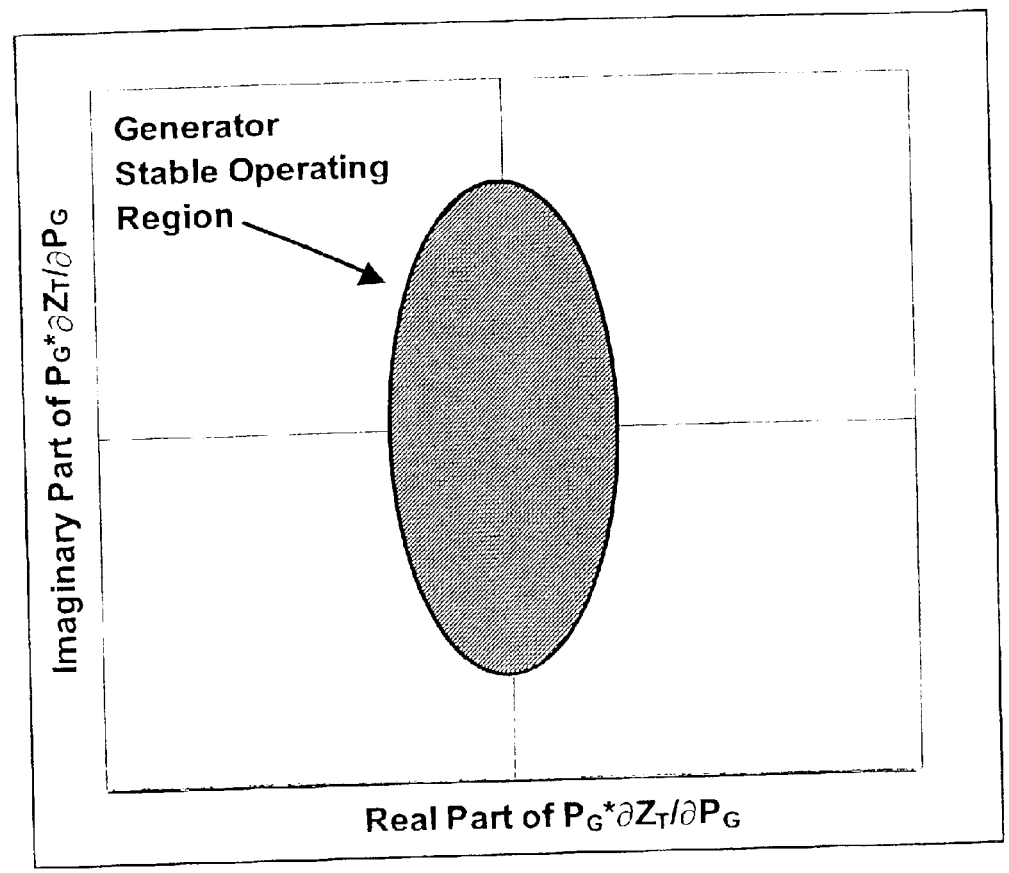

FIG. 17B shows, for an exemplary RF generator, the RF generator stable operating region.

Figure 17C:
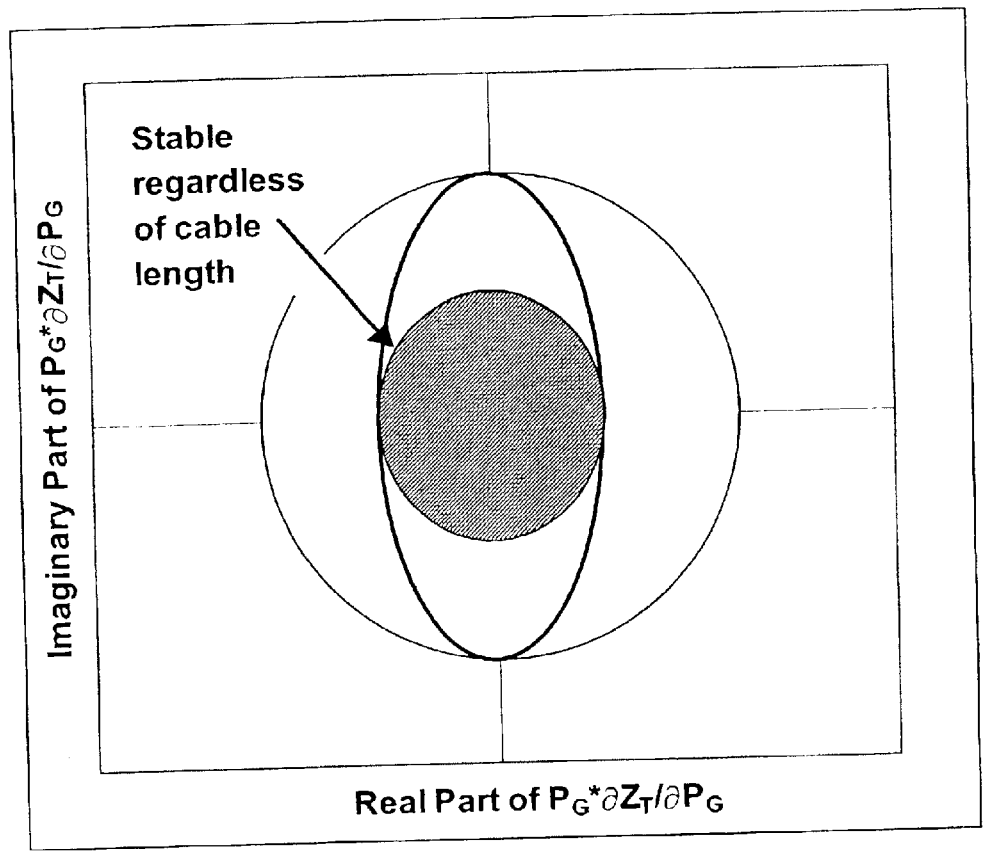

FIG. 17C shows, for an exemplary RF generator, values of generator output power times plasma impedance derivative that are always stable regardless of the phase of $$P_G \frac{\partial Z_T}{\partial P_G}.$$

Figure 17D:
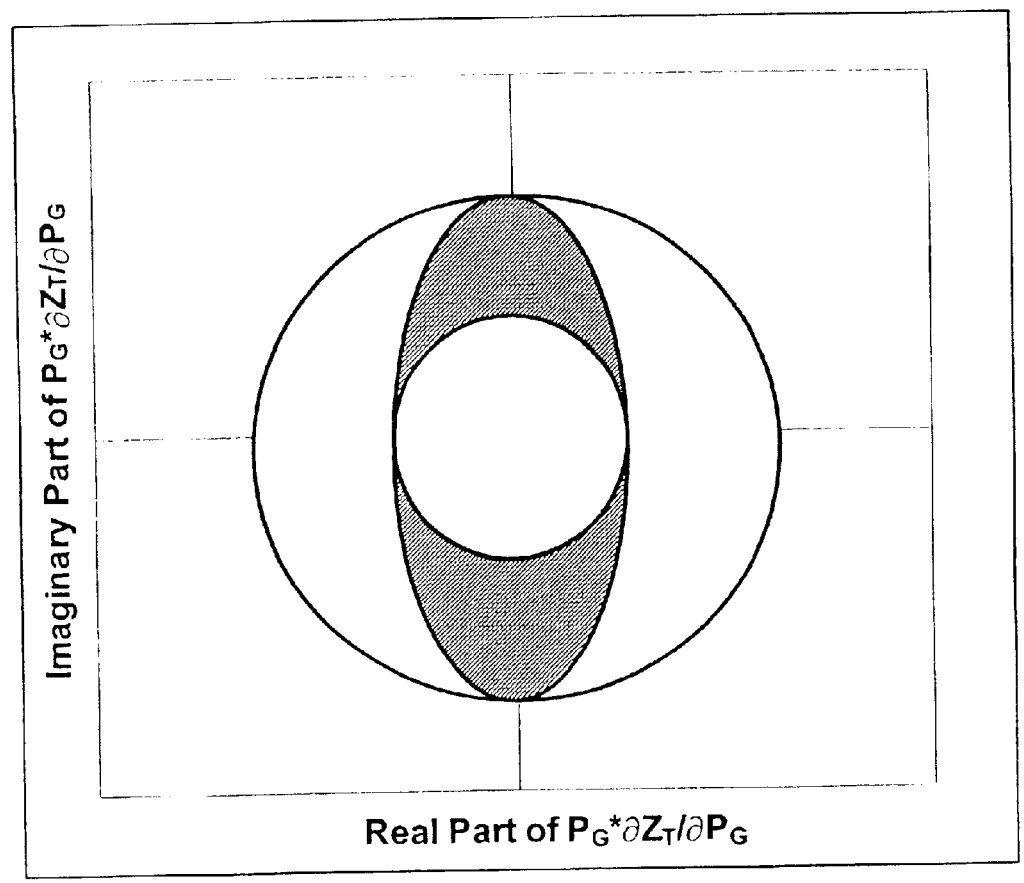

FIG. 17D shows, for an exemplary RF generator, values of generator output power times plasma impedance derivative that are stable but can become unstable for a change in phase of $$P_G \frac{\partial Z_T}{\partial P_G}.$$

Figure 17E:
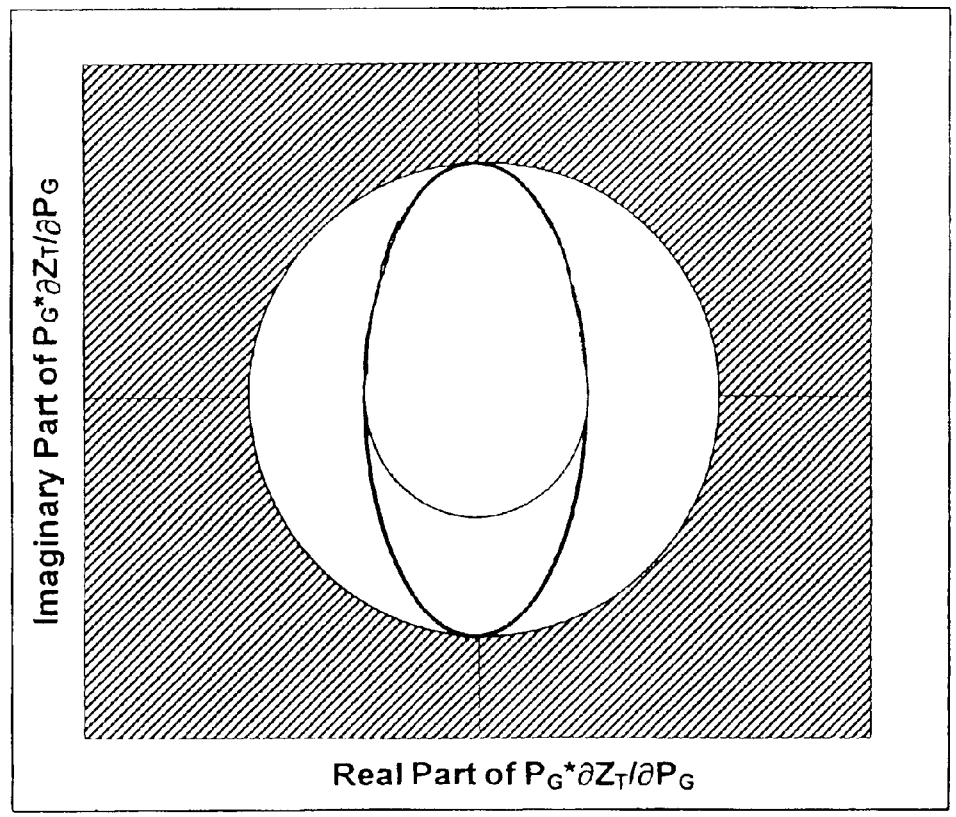

FIG. 17E shows, for an exemplary RF generator, the plot of the region wherein $$P_G \frac{\partial Z_T}{\partial P_G}$$

results in unstable operation, regardless of the phase of $$P_G \frac{\partial Z_T}{\partial P_G}$$

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
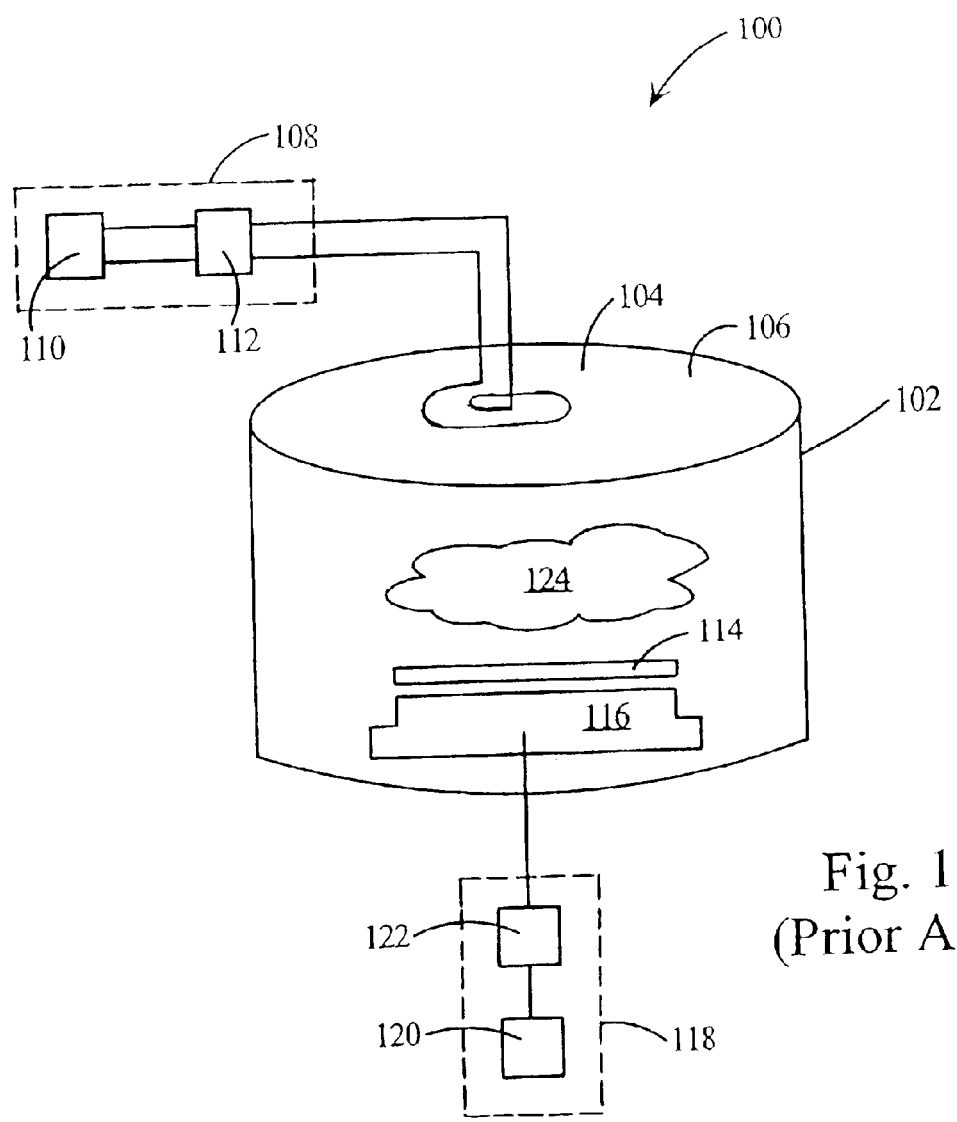
FIG. 1 illustrates a prior art inductive plasma processing chamber, which is configured for etching.
Figure 2:
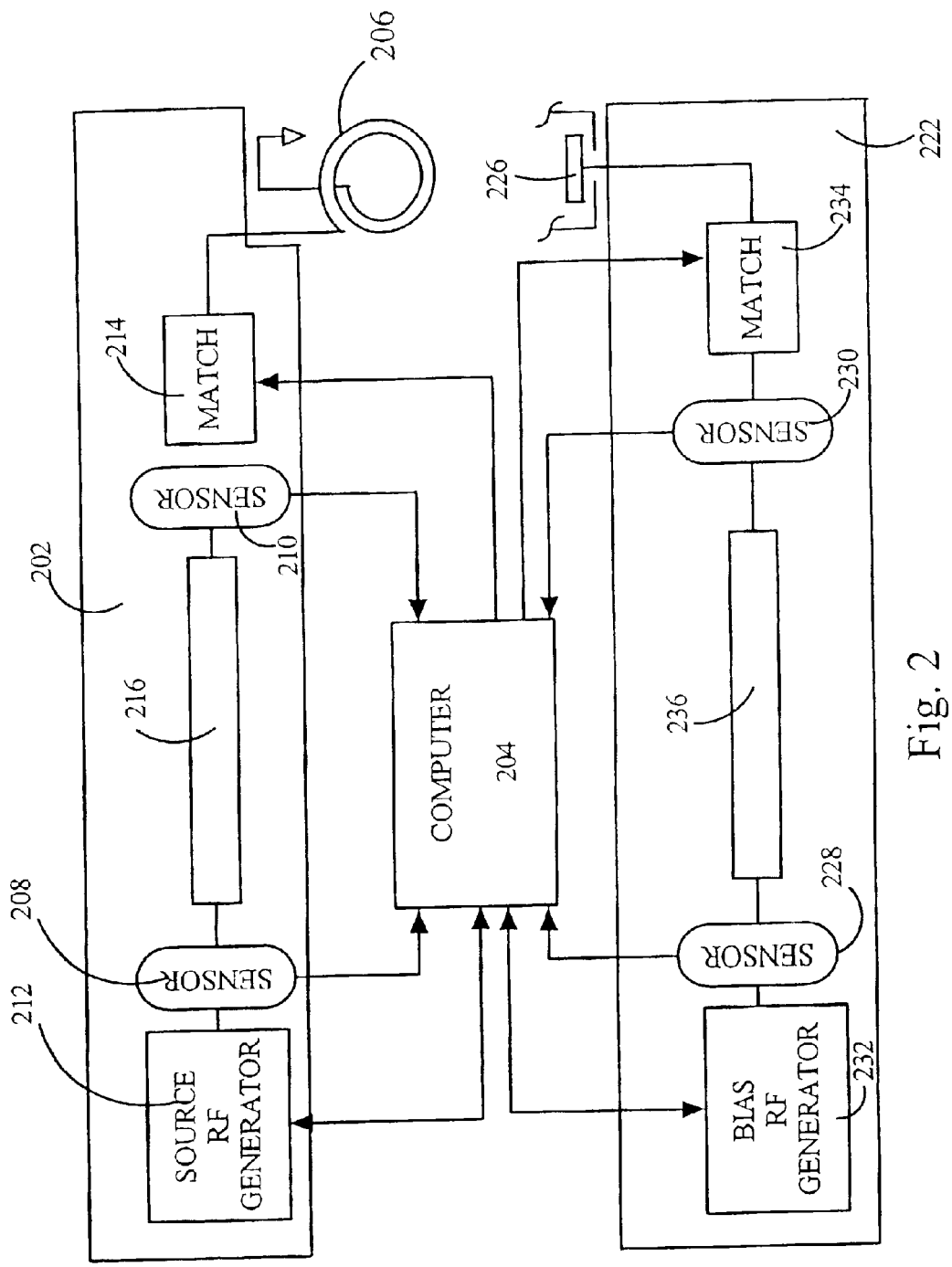
FIG. 2 is a block diagram illustrating the various electrical components of an exemplary RF power delivery arrangement involved in delivering RF power to the plasma in an exemplary inductively coupled plasma processing chamber.

In order to discuss the effects that derivatives of electrical load impedance with respect to delivered RF power exert on RF power stability, a brief review of an exemplary RF power delivery arrangement may be useful. FIG. 2 is a block diagram illustrating the various electrical components of an exemplary RF power delivery arrangement which is involved in delivering RF power to the plasma in an exemplary inductively coupled plasma processing chamber. It should be kept in mind that although an inductively coupled plasma processing system is arbitrarily chosen to facilitate discussion, the invention applies equally well to capacitively coupled plasma processing systems as well as to other plasma processing systems that generate and/or sustain their plasmas using other methods.

In FIG. 2, there is shown a source RF power system 202 coupled to a controlling computer 204 and a source RF antenna 206. Controlling computer 204 is a part of the feedback control loop that employs feedback from sensors 208 and 210 and/or from a source RF generator 212 to control source RF generator 212 and impedance matching network 214. Sensor 208 include sensors for monitoring parameters that reflect the performance of source RF generator 212. Thus, parameters such as the magnitude and/or phase of the RF current and voltage, the forward RF power from the source RF generator to the impedance matching network, the reflected RF power from the impedance matching network to the source RF generator, and the like may be measured by sensor 208. The information obtained by sensor 208 is employed by controlling computer 204 and source RF generator 212 to adjust the RF power delivery from source RF generator 212 during processing.

Sensor 210 include sensors for monitoring parameters that reflect the performance of impedance matching network 214. Thus, parameters such as the magnitude and/or phase of the RF current and voltage, the forward RF power from the source RF generator to the impedance matching network, the reflected RF power from the impedance matching network to the source RF generator, and the like may be measured by sensor 210. During operation, source RF generator generates RF power, which is delivered to source RF antenna 206 via a source RF transmission line 216 and impedance matching network 214 as shown.

In FIG. 2, there is also shown a bias RF power system 222 coupled to controlling computer 204 and a bias RF electrode 226. Controlling computer 204 performs an analogous role in bias RF power system 222. That is, controlling computer 204 is a part of the feedback control loop that employs feedback from sensors 228 and 230 and/or from a bias RF generator 232 to control bias RF generator 232 and impedance matching network 234. Sensors 228 and 230 perform functions analogous to those performed by sensors 208 and 210 in the source RF power system 202. During operation, bias RF generator 232 generates RF power, which is delivered to bias RF electrode 226 via a bias RF transmission line 236 and impedance matching network 234 as shown.

Figure 3:
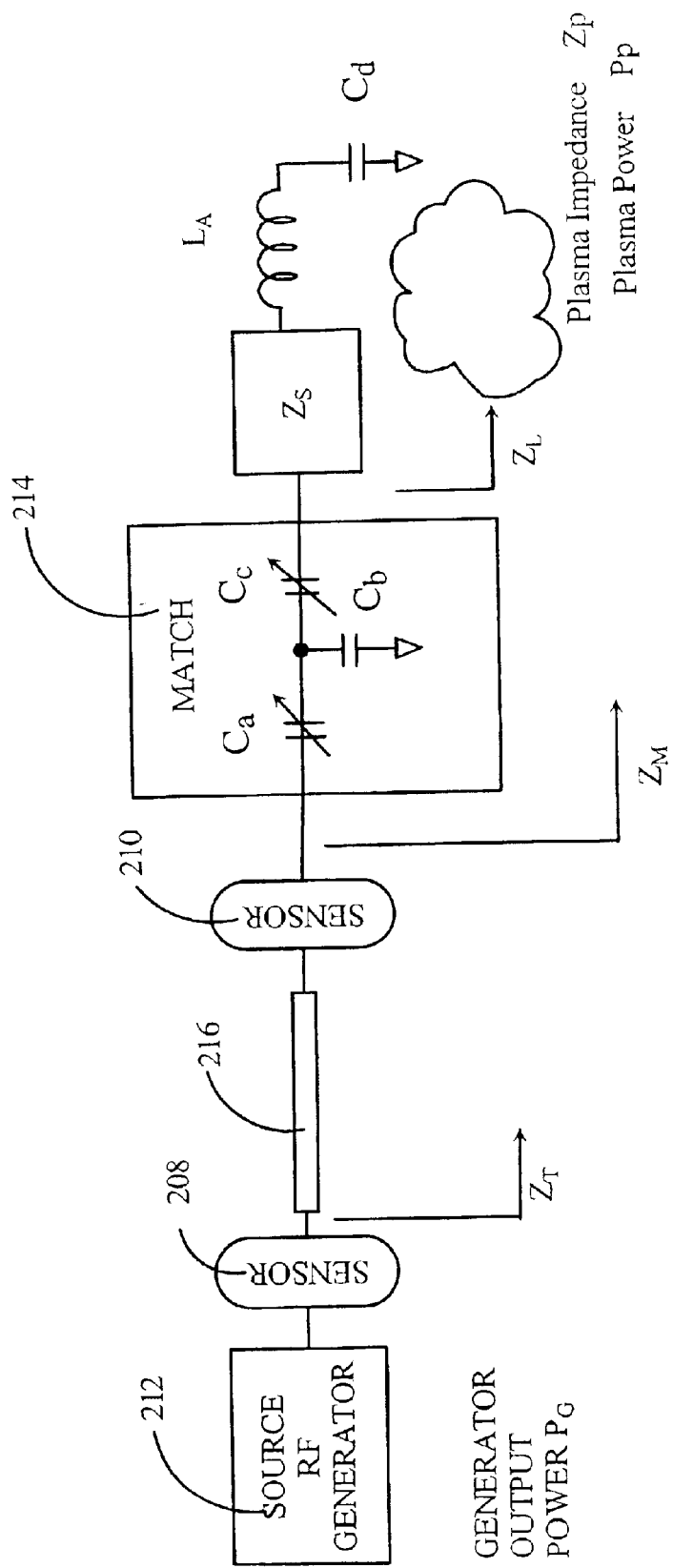
FIG. 3 shows the source RF power system of FIG. 2 in greater detail.

FIG. 3 shows the source RF power system 202 of FIG. 2 in greater detail, including labeling for various electrical parameters at various points in the system. In FIG. 2, the impedance matching network is arbitrarily chosen to be a T-type matching network to facilitate discussion. It should be noted, however, that the invention also applies with other matching network types, such as L-type or Π-type matching networks.

With reference to FIG. 3, there is shown a plasma having a plasma impedance $Z_P$, representing the complex impedance of the plasma. $Z_P = R_P + j\omega L_P$ where $R_P$ and $L_P$ are the plasma resistance and inductance, respectively, $j = \sqrt{-1}$, and $\omega = 2\pi f$ (f is the RF frequency, in Hz).

For this example of an inductive plasma source, the plasma can be modeled as the secondary loop of a transformer for which the RF antenna is the primary loop. In this model, the plasma impedance $Z_P$ is transformed into an effective impedance $Z_S$ in series with the antenna.

$Z_S = R_S + jX_S$, with $R_S$ and $X_S$ (reactance) given by:

$$R_S = \left(\frac{\omega^2 M^2 R_p}{R_p^2 + \omega^2 L_p^2}\right) \quad X_S = \left(\frac{-\omega^3 M^2 L_p}{R_p^2 + \omega^2 L_p^2}\right)$$

where M is the mutual inductance between inductors $L_A$ and $L_P$.

(This derivation can be found, for example, in Albert Lamm, "Observations Of Standing Waves On An Inductive Plasma Cell Modeled As A Uniform Transmission Line," J. Vac. Sci. Technol. A15, 2615 (1997), incorporated herein by reference).

Source RF antenna inductance $L_A$ (in henries) is attributable to the source RF antenna 206 of FIG. 2.

$X_A = \omega L_A$ is the inductive reactance, in ohms, of the source RF antenna.

Impedance matching network 214 of FIG. 2, which is arbitrarily selected as a T-type matching network in FIG. 3 for discussion purposes, is represented by three exemplary capacitors: $C_a$, $C_b$, $C_c$, of which $C_a$ and $C_c$ may be tunable. In FIG. 3, the impedance matching network is implemented by capacitors although inductors or a combination of capacitors and inductors may well be employed. A terminating capacitor $C_d$ is also shown in series with the source RF antenna inductance $L_A$.

$$X_a = \frac{-1}{\omega C_a}; \quad X_b = \frac{-1}{\omega C_b}; \quad X_c = \frac{-1}{\omega C_c}$$

are the capacitive reactances, in ohms, of capacitors $C_a$, $C_b$ and $C_c$.

$$X_d = \frac{-1}{\omega C_d}$$

is the capacitive reactance, in ohms, of terminating capacitor $C_d$.

$Z_M$ is the input impedance of the impedance matching network, including the effective series plasma impedance $Z_S$, the source RF antenna inductance $L_A$, the impedances of the matching network components $C_a$, $C_b$, and $C_c$, and the impedance of any terminating capacitance $C_d$.

$$Z_M = R_M + jX_M$$

$$R_M = \frac{X_b^2 R_S}{R_S^2 + (X_b + X_3)^2}$$

$$X_M = \frac{X_b R_S^2 + X_b X_3 (X_b + X_3)}{R_S^2 + (X_b + X_3)^2} + X_a \text{ where}$$

$$X_3 = X_c + X_S + X_A + X_d$$

where $X_3 = X_c + X_S + X_A + X_d$

In normal operation of the impedance matching network, capacitors $C_a$ and $C_c$ are generally adjusted so that $X_M = 0$ and $R_M = R_0$, where $R_0$ is the characteristic resistance of the source RF transmission line.

The input impedance $Z_M$ of the impedance matching network is transformed by the source RF transmission line into a transformed value $Z_T$ given by:

$$Z_T = R_0 \frac{Z_M + jR_0 \tan(2\pi L/\lambda)}{R_0 + jZ_M \tan(2\pi L/\lambda)} \quad \text{Equation 1}$$

where $R_0$ is the characteristic resistance of the RF transmission line, L is the length of the RF cable, and $\lambda$ is the wavelength of the RF wave in the transmission line (assuming lossless cable). (See, for example, Electronics Engineers' Handbook, Third Edition, D. Fink and D. Christiansen, editors, McGraw-Hill, N.Y., 1989, page 9–3)

In normal, tuned operation, $Z_M = R_0$ and $Z_T = R_0$.

$P_G$ represents the generator output power in watts, whereas $P_P$ represents the power actually delivered to the plasma. $P_G$ is equal to the sum of $P_P$ plus any power reflected back to the generator or dissipated in the matching circuit elements.

As mentioned earlier, the stability of the RF power delivery is highly important in achieving a satisfactory process result. FIG. 4A is an exemplary graph showing a process that experiences source RF power delivery instability at certain source RF delivered power set points. In exemplary FIG. 4A, the process is stable when the source RF delivered power set point is above 370 watts. Below 370 watts, the source RF power delivered to the plasma is no longer stable and the reflected RF power (as measured by, for example, sensors 208 of FIG. 2) becomes high.

FIG. 4B shows the observed optical emission of the plasma when source RF delivered power becomes unstable. As can be seen, the broadband optical emission intensity fluctuates widely, with the amplitude swing exceeding 25% during the instability period. As can be appreciated by those skilled in the art, such fluctuation severely degrades the process result and needs to be rectified.

In the past, the RF power delivery instability problem is addressed by trying out different RF generator/transmission cable length combinations until stable RF power delivery is achieved for the chosen process recipe. Having characterized an exemplary inductively coupled source RF power system in electrical terms, the RF power instability problem for any RF power system may now be discussed in view of the characterization done with respect to FIGS. 2 and 3.

In general, the load impedance $Z_L$ (as seen by the matching network) includes $Z_S$ which depends on $P_P$, the power delivered to the plasma. The matching network transforms the load impedance $Z_L$ into the matching network input impedance $Z_M$. As a result, the matching network input impedance $Z_M$ is a function of the power delivered to the plasma $P_P$, or $$Z_M = Z_M(P_P)$$

When the matching network is tuned, $Z_M$ is typically (50+0j) $\Omega$.

RF generator systems typically contain an active feedback loop that maintains the generator forward (i.e., output) power or delivered power (i.e., forward power minus reflected power) equal to some pre-selected value. For changes in load impedance $Z_T$ (as seen by the generator) that occur on the time scales slow compared to the response time of the feedback circuit, the generator forward (or delivered) power will remain constant due to the operation of the feedback circuit.

However, the generator output power $P_G$ does vary with changes in load impedance $Z_T$ that occur on time scales comparable to or faster than the response time of the feedback circuit Thus, for time scales comparable to or faster than the response time of the feedback circuit, the generator output power $P_G$ is a function of the load impedance $Z_T$, or $$P_G = P_G(Z_T)$$

As mentioned earlier, the load impedance $Z_L$ (as seen by the matching network) depends on $P_P$, the power delivered to the plasma. For changes in the plasma impedance $Z_S$ that occur on a time scale slower than the response time of the impedance matching network, the matching network input impedance $Z_M = R_0$, and the matching network input impedance $Z_M$ and the load impedance $Z_T$ do not depend on the power delivered to the plasma $P_P$ or the generator output power $P_G$.

However, changes in the plasma impedance $Z_S$ that occur on a time scale equal to or faster than the response time of the impedance matching network results in $Z_M \neq R_0$ and the load impedance $Z_T$ is a function of the power delivered to the plasma $P_P$, or $Z_T=Z_T(P_P)$. If the relationship between $P_G$ and $P_P$ is known, then the load impedance can be expressed as a function of $P_G$ as follows:

$$Z_T = Z_T(P_G)$$

The relationship between the matching network input impedance $Z_M$, the load impedance $Z_T$, and the generator output power $P_G$ is symbolically illustrated in FIG. 5.

It is believed that the RF power delivery instability depends on the loop gain of the feedback loop between the generator load impedance $Z_T$, and the generator output power $P_G$. More specifically, the overall gain of the loop of interdependence of the load impedance $Z_T$ and the generator output power $P_G$ contributes substantially to the RF power delivery instability.

For small changes in the load impedance $Z_T$ when the value of $Z_T$ is around the value of $R_0$, the dependence of $Z_T$ on the generator output power $P_G$ can be expressed as the derivative $$\left.\frac{\partial Z_T}{\partial P_G}\right|_{Z_T=R_O},$$

which is a complex number.

The dependence of the generator output power $P_G$ on the load impedance $Z_T$ can be expressed as the gradient $\nabla P_G(Z_T)$, which is also a complex number.

The interdependence of $Z_T$ on $P_G$ and of $P_G$ on $Z_T$ is illustrated schematically in FIG. 6, wherein $P_G$ is a real number and $Z_T$ is a complex number. The tendency for the RF power delivery system to be stable or unstable depends on $$\frac{\partial Z_T}{\partial P_G} \cdot \nabla P_G$$

where • is a dot product.

Furthermore, it is hypothesized that when the value of $$\frac{\partial Z_T}{\partial P_G} \cdot \nabla P_G$$

is reduced, the RF power delivery to the plasma tends to be more stable. In accordance with one aspect of the present invention, the reduction in $$\frac{\partial Z_T}{\partial P_G}$$

is achieved by techniques that happen to "waste" a portion of the RF generator output power $P_G$, thereby requiring an increase in $P_G$ in order to maintain the same power $P_P$ delivered to the plasma. However, it is necessary to ascertain that an increase in the RF generator output power $P_G$ does not cause a detrimental change in $\nabla P_G(Z_T)$, which may negate the benefit of reducing $$\frac{\partial Z_T}{\partial P_G}.$$

FIGS. 7A and 7B show that this is not the case.

When changes in the generator load impedance occurs at time scales faster than the generator feedback control bandwidth, the RF generator may be modeled as an RF voltage source with an output impedance $Z_{OUT}$ and load impedance $Z_{LOAD}$.

This model is shown in FIG. 7A.

For such a model, it is observed that there exist normalized power output contours, which are determined by the generator characteristics and have a general shape $G(Z_{LOAD})$, which is independent of output power. FIG. 7B shows exemplary RF power output contours as a function of load impedance $Z_{LOAD}$ for a hypothetical RF generator when changes in the load impedance $Z_{LOAD}$ occur for time scales faster than the generator feedback circuit response time. In FIG. 7B, the generator output impedance $Z_{OUT}$ is arbitrarily chosen to be $(5+0j)$ Ω, and the RF generator has a nominal output power of 100% into a 50Ω load. The output power is 120% into a 40 Ω load and 86% into a 60Ω load. The hypothetical generator can reasonably model a typical RF generator although in reality the imaginary part of a typical generator's output impedance is not at zero but the real part of a typical generator's output impedance is typically low, on the order of the few ohms, in order to maintain a high level of efficiency. Including a non-zero imaginary part will change the shape of the power contours somewhat but does not change the premise that these power contours exist.

It should be noted at this point that for changes in load impedance $Z_{LOAD}$ that occur much slower than the generator feedback circuit response time, the generator feedback circuit tends to keep the output power approximately constant. Further, for changes in load impedance $Z_{LOAD}$ that occur on about the same time scale as the generator feedback circuit response time, the output power depends on the details of the feedback circuit, and the power contours may have more complicated shapes than those show in FIG. 7B.

In the case where changes in the load impedance $Z_{LOAD}$ occur faster than the generator feedback circuit response time, the RF power contours appear to be determined by the specific characteristics of individual generators and have a general shape $G(Z_{LOAD})$, which is independent of output power. Assuming that the generator output power is $P_{0(R0)}$ for load impedance $R_0$, then the generator output power for any other load impedance $Z_{Load}$ is given by:

$$P_G(Z_{Load}) = P_G(R_0) * G(Z_{LOAD}), \text{ and } \nabla P_G = P_G \nabla G$$

Under this assumption, the stability of the RF power delivery may be determined by $$\frac{\partial Z_T}{\partial P_G} \cdot \nabla P_G = P_G \frac{\partial Z_T}{\partial P_G} \cdot \nabla G = P_G \frac{dP_P}{dP_G} \frac{\partial Z_T}{\partial P_P} \cdot \nabla G \qquad \text{Equation 2}$$

where the term $\nabla G$ depends on the generator characteristics and is generally independent of the generator output power $P_G$. The term $$\frac{\partial Z_T}{\partial P}$$

depends on the characteristics of the plasma (defined by gas composition, pressure, delivered power $P_P$, etc.), the impedance matching network, and the length of the RF transmission line. As an aside, it should be noted that the length of the RF transmission line affects the direction, but not the magnitude of the impedance derivative (See Appendix A).

It is observed that, for a given RF generator, plasmas (defined by gas composition, pressure, delivered power $P_P$, etc.) that have low values of $$P_G\left|\frac{\partial Z_T}{\partial P_G}\right|$$

are stable over a wider range of lengths of RF transmission line than are plasmas with high values of $$P_G\left|\frac{\partial Z_T}{\partial P_G}\right|.$$

From these observations and deductions, it is believed that RF power delivery stability to the plasma load may be improved by at least two mechanisms:

1) changing the impedance matching network to reduce the magnitude of $$P_G\left|\frac{\partial Z_T}{\partial P_G}\right|,$$

evaluated at $Z_T=R_0$. This improvement can be performed with any existing or future RF generator; and 2) changing the generator output characteristics to reduce the magnitude of $$|\nabla G| = \frac{1}{P_G}|\nabla P_G|.$$

In one embodiment, the value of $$P_G\left|\frac{\partial Z_T}{\partial P_G}\right|$$

may be reduced by intentionally introducing additional resistance in series with the input of the matching network and/or coupled to one of the terminals of the impedance devices of the matching network such that the current that flows into the input terminal also flows through the additional resistance (for example in the cases shown in FIGS. 8B and 8D, which are discussed later herein).

As the term is employed herein, the matching network has an input terminal and an output terminal. The input terminal of the matching network represents the terminal disposed toward the RF generator, while the output terminal of the matching network represents the terminal disposed toward the load (e.g., the RF antenna).

The matching circuit that comprises the existing matching network and the additional resistor remains tuned, i.e., not mistuned, for this embodiment. As the term is employed therein, the matching circuit is considered tuned or in tune when its input impedance substantially equals the characteristic impedance of the RF transmission line, i.e., these two values are considered equal within industry-accepted tolerance since in the real world, absolutely exact matching is not always possible or practical.

Figure 8A:
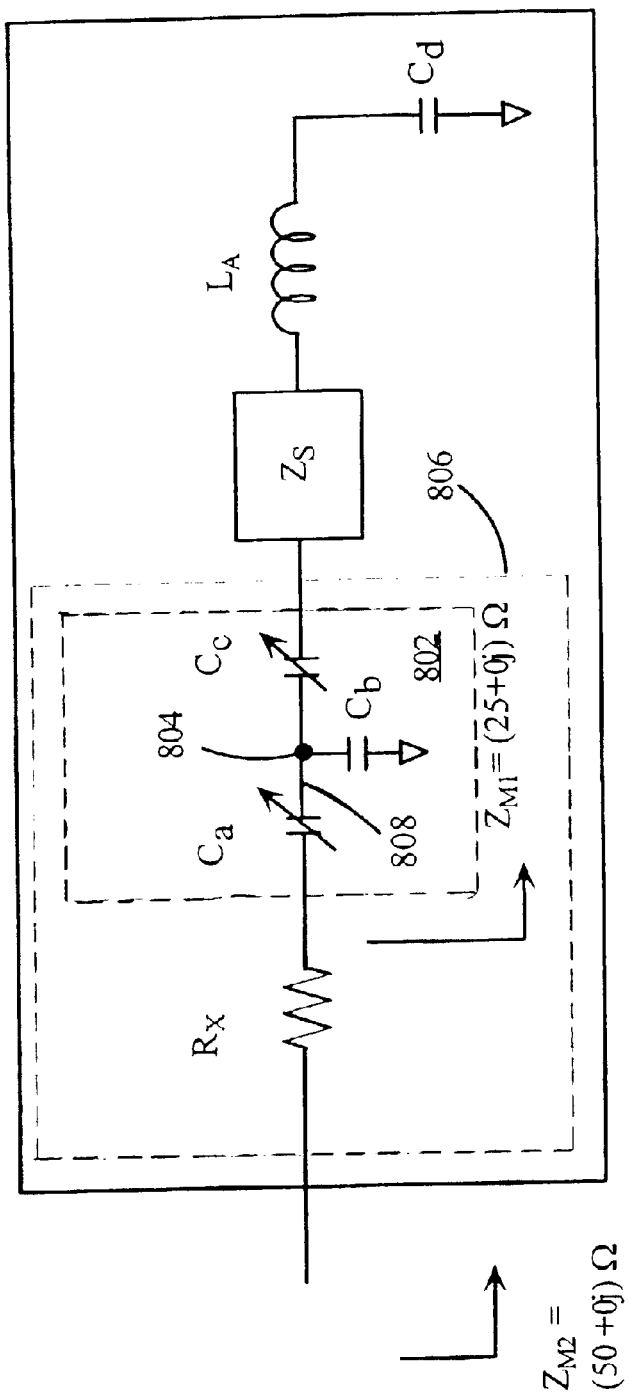
Figure 8B:
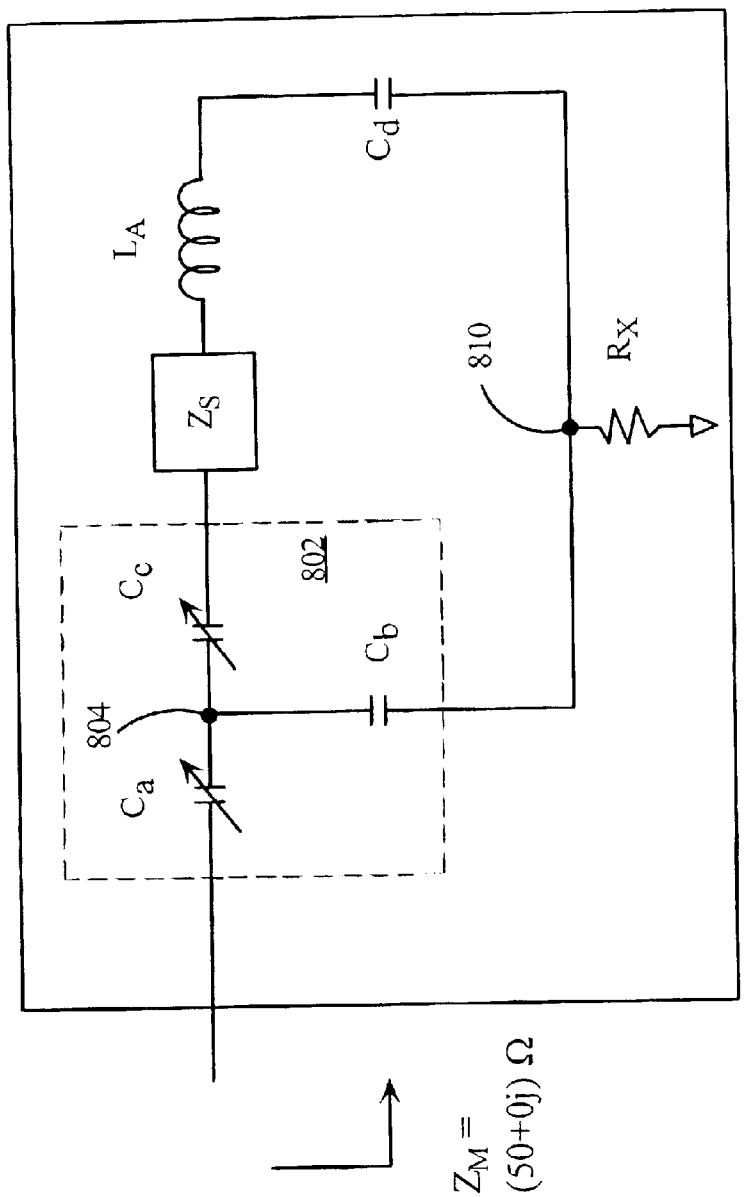

FIG. 8A is an exemplary circuit diagram illustrating this embodiment. In FIG. 8A, a power resistor $R_X$ is inserted in series with the input of T-match network 802. For ease of discussion, assume that $R_X$ has the value of 25Ω. The addition of a high-power 25Ω RF resistor in series with input of matching network 802 allows the modified matching circuit, which includes $R_X$, to stay tuned to 50Ω (i.e, $Z_{M2}$=50+0j Ω) even though the matching network 802 itself now tunes to only 25Ω (i.e, $Z_{M1}$=25+0j Ω). Tuning the matching network 802 to $Z_{M1}$=25Ω effectively reduces the value of $R_M$ by half, and according to equation C6 of Appendix C, reduces the impedance derivative $$\left|\frac{\partial Z_M}{\partial Z_S}\right|$$

by half.

It can be seen that the matching network transforms $Z_S$ into $Z_{M1}$=(25+0j) Ω, and in the process magnifies the impedance derivatives by the ratio $$\left|\frac{dZ_{M1}}{dZ_S}\right| = \frac{25\Omega}{R_S}.$$

But since $Z_{M2}$=25Ω+$Z_{M1}$ (the 25Ω part does not depend on the power delivered to the plasma $P_P$), $$\left|\frac{\partial Z_{M2}}{\partial P_P}\right| = \left|\frac{\partial Z_{M1}}{\partial P_P}\right| = \frac{25\Omega}{R_S}*\left|\frac{\partial Z_S}{\partial P_P}\right|,$$

which is only half as large as the value $$\frac{50\Omega}{R_S}*\left|\frac{\partial Z_S}{\partial P_P}\right|$$

of the unmodified matching network.

The total loop gain, believed responsible for the instability, is given by $$P_G\frac{\partial Z_T}{\partial P_G}*\nabla G = P_G\frac{dZ_T}{dZ_M}\frac{dZ_M}{dZ_S}\frac{dP_P}{dP_G}\frac{\partial Z_S}{\partial P_P}*\nabla G$$

In this example for which $R_X$=25Ω, $P_G$ is twice as big as for $$R_X = 0, \frac{dZ_T}{dZ_M}$$

has magnitude=1, $$\frac{dZ_M}{dZ_S}$$

has magnitude half as big as for $R_X$=0, $$\frac{dP_P}{dP_G} = 0.5,$$

and $$\frac{\partial Z_S}{\partial P_P}$$

and $\nabla G$ are the same, so the net effect is to reduce the magnitude of the loop gain by a factor of 2x.

Note that in this case, the matching circuit 806 that comprises matching network 802 and resistor $R_X$ remains in tune to the characteristic impedance of the RF transmission line. No RF power will be reflected from the matching network. Approximately half of the generator's power will be dissipated in the 25Ω resistor $R_X$ so the generator output $P_G$ should be twice as large to get the same power $P_P$ delivered to the plasma. Further, the resistor $R_X$ needs to handle a large amount of power dissipation and should be selected and/or designed appropriately. For example, in some cases, liquid-cooled high power resistive arrangements may be employed.

Note that in FIG. 8A, although the resistor is shown disposed to the left of the matching network's variable capacitor $C_a$ along the current path that flows through variable capacitor $C_a$ (i.e., the resistor is disposed between the RF transmission line and the input terminal of the matching network), the resistor may also be disposed between variable capacitor $C_a$ and a terminal 804 (the T-junction in FIG. 8A) of the matching network. In another embodiment, both the variable capacitor $C_b$ of the match network 802 and the terminating capacitor $C_d$ are coupled together prior to being coupled to ground. This is shown in FIG. 8B. In this case, the resistor $R_X$ may be disposed along the current path that flows through the equivalent impedance that is formed by capacitors $C_b$ and $C_d$ in parallel and ground.

Figure 8C:
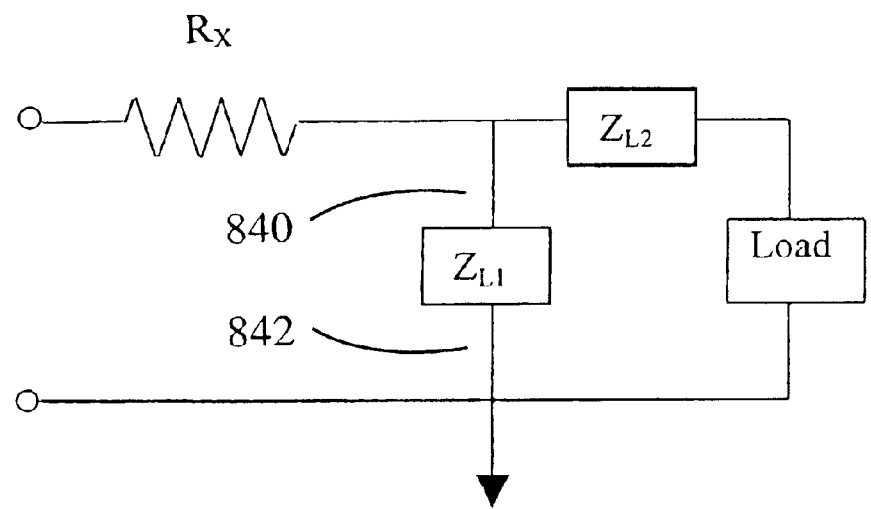
Figure 8D:
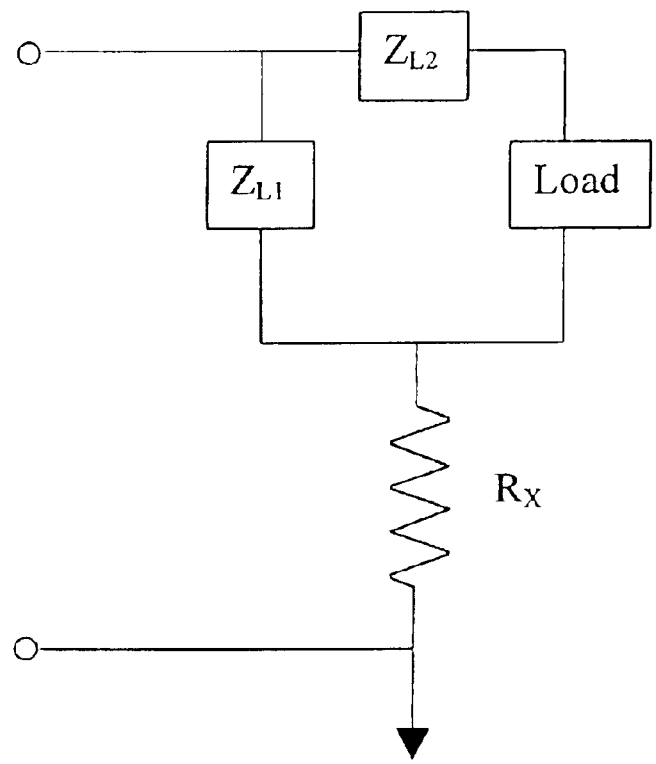

Further, in FIG. 8A, a T-match network is employed as an example although it should be noted that analogous results would also be obtained for L-match and Π-match networks (see Appendices B and C herein). In an L-match, the additional resistance may be provided, for example, between the RF transmission line and the input terminal of the L-match, such as shown in FIG. 8C, or may be provided in series between the equivalent impedance that is formed by impedance elements $Z_{L1}$ and $Z_{L2}$ in parallel and ground (as shown in FIG. 8D). In either case (e.g., FIG. 8C or FIG. 8D), the additional resistance is considered to be in series with the input of the matching network.

In the L-match case of FIG. 8C (and analogously in FIG. 8D), the additional resistance may alternatively be provided at locations 840 or 842. Although the additional resistance is not considered to be in series with the input of the matching network when disposed at position 840 or 842, the provision of the additional resistance at these locations also reduces the impedance derivatives and results in improved plasma stability.

Figure 8E:
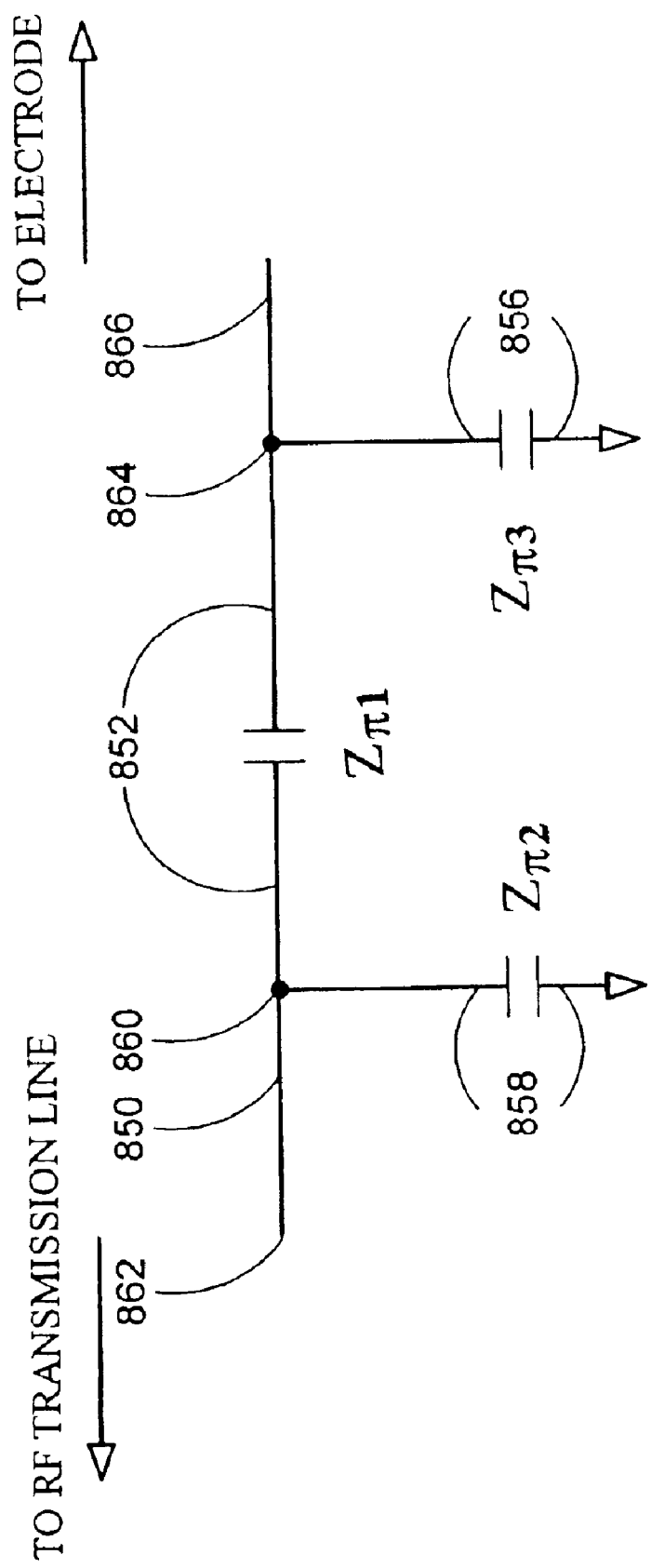

In the Π-match case such as that shown in FIG. 8E, the additional resistance may be provided, for example, between input terminal 862 and the line-side T-junction 860 of the Π-match at the location indicated by reference number 850. The additional resistance may alternately be provided, for example, between the line-side T-junction 860 of the Π-match and capacitor $Z_{Π2}$ at the location indicated by reference number 858. The additional resistance may alternately be provided, for example, between the electrode-side T-junction 864 of the Π-match and capacitor $Z_{Π3}$ at the location indicated by reference number 856. The additional resistance may alternately be coupled, for example, between the line-side T-junction 860 of the Π-match and electrode-side T-junction 864 of the Π-match capacitor $Z_{Π2}$ at the location indicated by reference number 852. The point is that the additional resistance, in conjunction with a matching network that is tuned to a lower value, would present in combination a matching circuit having an input impedance substantially equal to the characteristic impedance of the RF transmission line.

When the additional resistance is implemented at positions 852, 856, or 858, for example, the value of the additional resistance required to reduce the impedance derivatives by a certain percentage point may differ from the value of the additional resistance $R_X$ required to reduce the impedance derivatives by the same percentage point when that additional resistance $R_X$ is implemented in series with the input impedance of the matching network, e.g., at location 850.

Furthermore, the variable impedance elements of the matching network (T-match 802, or L-match, or Π-match) may be implemented using inductors or a combination of inductors/capacitors instead. It is expected that the resistor $R_X$ can be positioned analogously in the manner discussed above in an RF power system utilizing inductors or a combination of inductors/capacitors for the matching network's impedance elements.

Furthermore, although 25Ω is chosen to be the value of $R_X$ to facilitate discussion, $R_X$ can have any desired value. In one embodiment, the resistance value of the additional resistor is between 10% and 90% of the total input impedance of the matching circuit (e.g., 806 of FIG. 8A). In another embodiment, the resistance value of the resistor is between 20% and 80% of the total input impedance of the matching circuit. Thus, the resistance value of the additional resistor $R_X$, while larger than the typical inherent resistance along the same current path in existing RF power systems, may be varied so as to reduce power "waste" while finishing the desired plasma stabilizing effect for a given process.

Furthermore, the additional resistor $R_X$ may even be a variable or a switched resistor. That is, the additional resistor $R_X$ may be made variable in resistance to account for different processes or switched off if not needed. For example, some processes may be stable without requiring the use of the resistor $R_X$. In this case, the resistor $R_X$ may be turned off, and may be turned on only when another process recipe requires the extra plasma stabilizing effects thereof. Since a larger resistor "wastes" a larger amount of power, it may be preferable to employ a variable resistor so that an appropriately sized resistor value that is sufficient to provide the desired plasma stabilizing effect for a given process can be utilized.

One should note that resistor $R_X$ may not necessarily be a discrete resistor. For example, it may be possible to intentionally employ a low conductance (e.g., higher resistance) material for components such as fixed inductors (such as those employed in some matching networks), connectors such as the conductor or strap between the RF transmission line and the input of the matching network, or the conductor or strap between an element of the matching network and a terminal therein along the relevant current path (e.g., between capacitor $C_a$ and terminal 804 in the example of FIG. 8A). The low conductance material represents materials whose resistance is higher than those associated with typical conductors (such as copper, silver-plated copper, aluminum, or their alloys) and may include, for example, 316 stainless steel, nichrome, chromel, graphite, SiC, or the like. The point is resistor $R_X$ would typically be larger than the inherent resistance of typical conductors and may be implemented in various ways.

FIG. 9 shows another alternative embodiment wherein the impedance derivatives are reduced by intentionally adding resistance $R_Y$ in series with the effective series plasma impedance $Z_S$. With reference to equation C6 of Appendix C, the implementation of the exemplary circuit of FIG. 9 essentially replaces the impedance $Z_S=X_S+R_S$ with the new impedance $Z_S+R_Y=X_S+R_S+R_Y$.

Accordingly, the modified equation C6 for Appendix C is:

$$\left| \frac{dZ_M}{d(Z_S+R_Y)} \right| = \frac{R_M}{R_S+R_Y}$$

In this case, since $R_Y$ is a fixed-value resistor, its value does not depend on power delivered to the plasma $P_P$, and $$\left|\frac{dZ_M}{d(Z_S + R_Y)}\right| = \left|\frac{dZ_M}{dZ_S}\right|$$

With the addition of resistor $R_Y$, the magnitude $$\left|\frac{dZ_M}{dZ_S}\right|$$

of the variation of the match network input impedance $Z_M$ with respect to the series plasma impedance $Z_S$ is lower by a factor of $$\frac{R_S}{R_S + R_Y}$$

than when $R_Y$ is not present.

In this example, a fraction $$\frac{R_Y}{R_S + R_Y}$$

of the generator output power $P_G$ is dissipated in the resistor $R_Y$, so the generator output power must be increased by the factor $$\frac{R_S + R_Y}{R_S}$$

in order for the power $P_P$ delivered to the plasma to remain the same.

The total loop gain, believed responsible for the instability, is given by $$P_G \frac{\partial Z_T}{\partial P_G} \cdot \nabla G = P_G \frac{dZ_T}{dZ_M} \frac{dZ_M}{dZ_S} \frac{dP_P}{dP_G} \frac{\partial Z_S}{\partial P_P} \cdot \nabla G.$$

Adding resistor $R_Y$ requires that $P_G$ increase by a factor of $$\frac{R_S + R_Y}{R_S}$$

relative to the case with no added resistor $R_Y$.

$$\frac{dZ_T}{dZ_M}$$

has magnitude=1, $$\frac{dZ_M}{dZ_S}$$

has magnitude that is smaller by the factor $$\frac{R_S}{R_S + R_Y}, \frac{dP_P}{dP_G}$$

is smaller by $$\frac{R_S}{R_S + R_Y}, \text{ and } \frac{\partial Z_S}{\partial P_P}$$

and $\nabla G$ are the same, so the net effect is to reduce the magnitude of the loop gain by a factor of $$\frac{R_S}{R_S + R_Y}.$$

Note that the matching circuit that comprises the matching network 902 and the additional resistor $R_Y$ is still preferably tuned to the characteristic impedance of the RF transmission line, e.g., 50Ω. In the case where an existing matching circuit is retrofitted by adding the additional resistor $R_Y$, for example, the impedance elements of the matching network may be tuned, after the additional resistor $R_Y$ is added, to tune the input impedance of the matching circuit to be substantially equal to the characteristic impedance of the RF transmission line.

If $R_S = R_Y$ in our example, the magnitude of loop gain of the instability is only half as large as the case when $R_Y$ is not present. For the example of $R_Y = R_S$, approximately half of the generator's power will be dissipated in the resistor $R_Y$ so the generator output $P_G$ should be at least twice as large to get the same power $P_P$ delivered to the plasma. As in the example of FIG. 8A, the resistor $R_Y$ needs to handle a large amount of power dissipation and should be selected accordingly. Further, $R_Y$ is equal to $R_S$ in the case of FIG. 9, which may be substantially lower than 25Ω. One should also note that the voltage across the LC resonance circuit formed by capacitors $C_b$, $C_c$, and $L_A$ of FIG. 9 may be high. These factors need to be taken into consideration when selecting the resistor $R_Y$.

Note that in FIG. 9, although the resistor $R_Y$ is shown disposed in between the matching network's variable capacitor $C_c$ along the current path that flows through the inductive coil (represented by source RF antenna inductance $L_A$), the resistor $R_Y$ may be disposed at other locations along the current loop. For example, the resistor $R_Y$ may be disposed at any of alternate locations 910, 914, 916, 918, 920, or 922 in FIG. 9.

Further, in FIG. 9, a T-match network is employed as an example although it should be noted that analogous results would also be obtained for L-match and Π-match networks (see Appendices B and C herein). In the L-match case, the capacitors $C_c$ and $C_b$ of FIG. 9 may be thought of as the two capacitors of the L-match (with capacitor $C_a$ being absent from the figure and the capacitor $C_b$ being variable). In this case, the resistor $R_Y$ may be coupled, for example, at the same locations discussed in connection with the T-match case. The Π-match case is analogous. Furthermore, the impedance elements of the matching network (T-match, or L-match, or Π-match) may be implemented instead using inductors. It is expected that the resistor $R_Y$ can be positioned analogously in the manner discussed above in an RF power system utilizing inductors for the matching network's impedance elements.

It should also be noted that although $R_Y$ is chosen to have the value of RS (i.e., the series equivalent plasma load resistance) to simplify the discussion, $R_Y$ can have any desired value (which of course changes the amount of power dissipated thereby as well as the degree of stability improvement). In one embodiment, the resistance value of the additional resistor is between 10% and 90% of the resistance $R_S+R_Y$. In another embodiment, the resistance value of the resistor is between 20% and 80% of the resistance $R_S+R_Y$. Thus, the resistance value of the additional resistor $R_Y$, while larger than the typical inherent resistance along the same current path in existing RF power system, may be varied so as to reduce power "waste" while furnishing the desired plasma stabilizing quality for a given process.

Furthermore, the additional resistor $R_Y$ may even be a variable or a switched resistor. That is, the additional resistor $R_Y$ may be made variable in resistance to account for different processes or switched off if not needed. For example, some processes may be stable without requiring the use of the resistor $R_Y$. In this case, the resistor $R_Y$ may be turned off, and may be turned on only when another process recipe requires the extra plasma stabilizing effects thereof. Since a larger resistor "wastes" a larger amount of power, it may be preferable to employ a variable resistor so that an appropriately sized resistor value that is sufficient to provide the desired plasma stabilizing effect for a given process can be utilized.

One should note that resistor $R_Y$ may not necessarily be a discrete resistor. For example, it may be possible to intentionally employ a low conductance material for components such as fixed inductors (such as those employed in some matching networks), connectors such as the conductor or strap between an element of the matching network and a terminal therein along the relevant current path (e.g., along the current loop through variable capacitors $C_b$ and $C_c$, $Z_S$, $L_A$, and inductor $C_d$), or connectors between components along that relevant current path. The low conductance material represents materials whose resistance is higher than those associated with typical RF conductors (such as copper, silver-plated copper, aluminum, or their alloys) and may include, for example, 316 stainless steel, nichrome, chromel, graphite, SiC, or the like. The point is resistor $R_Y$ would typically be larger than the inherent resistance of typical conductors and may be implemented in various ways.

FIG. 10A shows another embodiment where the impedance derivatives are reduced by using an RF power attenuator. In FIG. 10A, the attenuator consists of three resistors arranged in a T-network although it should be noted that the same result would also be obtained for any of a number of different attenuator configurations, including a Π-network (FIG. 10B), an L-network, a bridged-T network, etc.

In FIG. 10A, the RF power attenuator 1002 and the RF transmission line 1004 are inserted in series between the RF transmission line 1006 and the matching network 1008 as shown. Note that in the example of FIG. 10A, matching network 1008 is still tuned to 50Ω. There is a load impedance at the output of the RF generator 1010 of 50Ω. RF power attenuator 1002 transforms the load impedance at the RF generator output to 50Ω. In other words, as far as impedance is concerned, RF power attenuator 1002 has essentially no effect. However, RF power attenuator 1002 does have an effect on the impedance change by magnifying the magnitude of the impedance change at one end by some ratio prior to outputting the impedance at the other end.

The values of resistors $R_1$, $R_2$, and $R_3$ may be modified as necessary to obtain the desired power attenuation in response to a change in impedance. If $R_1=R_3=8.55Ω$ and $R_2=141.9Ω$, then the RF power attenuator transmits 50% of power and dissipates 50% of power.

However, the attenuator reduces the magnitude of $$\left|\frac{dZ_T}{dZ_M}\right|$$

to 0.5, as will be shown below. With reference to FIG. 10A, $Z_M$ is the input impedance of the matching network, $Z_4$ is the impedance of the matching network as transformed by RF transmission line 1004, $Z_5$ is the input impedance of the attenuator, and $Z_T$ is the input impedance of the attenuator as transformed by RF transmission line 1006. The magnitudes of $$\left|\frac{dZ_4}{dZ_M}\right| \text{ and } \left|\frac{dZ_T}{dZ_5}\right|$$

are equal to 1.0 as shown in Appendix A. Attenuator 1002 has input impedance $Z_5$ given by:

$$Z_5 = R_1 + \frac{R_2(R_3 + Z_4)}{R_2 + R_3 + Z_4} = R_1 + [R_2(R_3 + Z_4)][R_2 + R_3 + Z_4]^{-1}$$

For $Z_4=50Ω$ and the values of $R_1$, $R_2$, and $R_3$ given above, $Z_5=50Ω$.

The equation for $Z_5$ can be differentiated to give the variation of $Z_5$ with respect to changes in $Z_4$:

$$\frac{dZ_5}{dZ_4} = R_2[(R_2 + R_3 + Z_4)^{-1} - (R_3 + Z_4)(R_2 + R_3 + Z_4)^{-2}]$$

$$= \frac{R_2^2}{(R_2 + R_3 + Z_4)^2}$$

Evaluated at $Z_4=50Ω$;

$$\left.\left|\frac{dZ_5}{dZ_4}\right|\right|_{Z_4=R_0} = \frac{(141.9Ω)^2}{(141.9Ω + 8.55Ω + 50Ω)^2} = \frac{1}{2}$$

As such, the load impedance derivative as seen by the generator is reduced and plasma stability is improved.

Note that in the case of FIG. 10A, the matching network is in tune, i.e., not mistuned. In the example of FIG. 10A, approximately half of the generator's power will be dissipated in the RF power attenuator so the generator output $P_G$ should be at twice as large to get the same power $P_P$ delivered to the plasma. It should be noted that although a T-type attenuator arrangement is employed to discuss the implementation of FIG. 10A, other types of attenuator may well be employed. For example, 50% attenuation can also be achieved with a Π-type RF power attenuator with R1=R3= 292.4Ω; R2=17.6Ω. FIG. 10B shows the configuration of such a Π-type RF power attenuator. In any RF power attenuator configuration, the values of the constituent resistors may be modified as necessary to obtain the desired power attenuation in response to a change in impedance.

The total loop gain, believed responsible for the instability, is given by $$P_G \frac{\partial Z_T}{\partial P_G} \cdot \nabla G = P_G \frac{dZ_T}{dZ_5} \frac{dZ_5}{dZ_4} \frac{dZ_4}{dZ_M} \frac{dZ_M}{dZ_S} \frac{dP_P}{dP_G} \frac{\partial Z_S}{\partial P_P} \cdot \nabla G$$

In this example for which the attenuator dissipates ½ of the RF power, $P_G$ must be twice as large in order for the power delivered to the plasma to be the same as without the attenuator.

$\frac{dZ_T}{dZ_S}$ and $\frac{dZ_4}{dZ_M}$ have magnitude=1, $\frac{dZ_5}{dZ_4}$ has magnitude=0.5, $\frac{dP_P}{dP_G} = 0.5$, and $\frac{dZ_M}{dZ_S}$, $\frac{\partial Z_S}{\partial P_P}$ and $\nabla G$ are the same, so the net effect is to reduce the magnitude of the loop gain by a factor of 2x.

As in the case with FIGS. 8A and 9, the matching network therein may have other configurations (e.g., L-match, Π-match, transformer, etc.). Additionally, the impedance devices in the matching network may be implemented using inductors instead, or using a combination of inductors and capacitors.

Note that although FIG. 10A shows both RF transmission lines 1004 and 1006, it is not absolutely necessary to have both RF transmission lines. For example, the RF power system of FIG. 10A may be implemented with only RF transmission line 1004, or with only RF transmission line 1006. It is the combined length of 1004 and 1006 that determines the phase of the impedance derivatives as seen by the RF generator, and this combined length may be implemented by one or multiple RF transmission lines.

FIG. 11 shows another embodiment wherein the impedance derivatives are reduced by designing the RF transmission line to have a lower characteristic impedance $R_0$. In the example of FIG. 11, the RF transmission line 1102 has a characteristic impedance $R_0$ of 25Ω instead of the widely accepted 50Ω. For example, two 50Ω RF lines in parallel may be employed to provide an RF transmission line having a a characteristic impedance $R_0$ of 25Ω. In that case, the impedance matching network 1104 is tuned to a nominal value of 25Ω instead of the widely accepted 50Ω, and RF generator 1106 is designed to operate with a 25Ω load instead of the widely accepted 50Ω.

The matching network transforms $Z_S$ into $Z_M$=25Ω, and in the process magnifies the impedance derivative with respect to plasma delivered power $P_P$ by $\frac{25\Omega}{R_S}$.

The magnitude of $\frac{dZ_M}{dP_P}$ is therefore only one-half as large as it would have been for $Z_M$=50Ω.

Note that in this case, the matching network is again in tune, i.e., not mistuned.

Unlike the situation of FIGS. 8A–8E, 9, and 10A–10B, however, a portion of the generator power is not dissipated in the matching circuit in order to achieve improved stability. Furthermore, although 25Ω is chosen to be the value of the characteristic impedance of the RF transmission line to facilitate discussion, the characteristic impedance of the RF transmission line $R_0$ can be reduced by any desired value (which of course changes the value by which the impedance derivatives are reduced).

It is important to realize that it is the reduction in impedance derivative magnitude, not the reduction in power delivery efficiency per se, that improves RF power delivery stability. This point is not obvious and needs to be emphasized. This point is proven by the implementation of FIG. 11 in which it is not necessary to dissipate power away in order to improve RF power delivery stability. To further illustrate the non-obviousness of the invention, FIG. 12 illustrates an implementation that merely dissipates power in the additional resistor without conferring the benefit of improving RF power delivery stability. In FIG. 12, an added resistor $R_Z$ is added in series between the RF generator 1202 and the RF transmission line 1204, which has the characteristic impedance of 50Ω in this example.

The added resistor $R_Z$ is given a value of also 50Ω to simplify the discussion. The proof of no change in impedance derivative in spite of the reduction in power delivery is show below.

$\left|\frac{dZ_M}{dZ_S}\right|_{Z_M=R_O} = \frac{R_O}{R_S}$ $\left|\frac{dZ_T}{dZ_M}\right| = 1$ $\left|\frac{dZ_6}{dZ_T}\right| = 1$ Thus, $\left|\frac{dZ_6}{dZ_T}\right| = \frac{R_O}{R_S}$, which is no change.

In other words, for the additional resistor $R_Z$=50Ω, half of the generator output power $P_G$ is dissipated without change in $\left|\frac{dZ_6}{dZ_P}\right|$.

In the implementation of FIG. 12, there is a mismatch between the generator 1202 (designed for a 50Ω load) and the total load impedance, which is ~100Ω, for $R_Z$=50Ω. One should note that in the case of FIG. 12, RF power delivery stability can still be affected as the degree of mismatch changes responsive to changes in the plasma impedance. Likewise, RF power delivery stability can also be affected when the RF generator runs into a different load, which changes the value at which $\nabla G$ is evaluated.

FIGS. 13A and 13B show the effects that reducing the impedance derivative has on RF power delivery stability. With respect to FIG. 13A, there are shown two experimentally determined regions of instability 1302 and 1304 for various combinations of plasma power ($P_P$) and RF cable length. In FIG. 13, the impedance derivative is reduced by employing an RF power attenuator (as shown in FIG. 10), and the region of instability 1306 of FIG. 13B is substantially smaller than those in FIG. 13A.

It is the case that every plasma process has some value of $$P_G \frac{\partial Z_T}{\partial P_G}.$$

This is a complex number with magnitude $$P_G \left| \frac{\partial Z_T}{\partial P_G} \right|$$

and phase $$\theta = \arg\left(\frac{\partial Z_T}{\partial P_G}\right).$$

To improve plasma stability, the invention involves, in one embodiment, ascertaining the resistance value that can be added to the existing RF power system in order to change the value of $$P_G \frac{\partial Z_T}{\partial P_G}$$

for an unstable plasma to be substantially identical and/or to approach more closely to that for a stable plasma.

FIG. 16 illustrates, in accordance with one embodiment of the present invention, a technique for ascertaining the value of the added resistance (e.g., $R_X$ in FIG. 8a) in order to make an unstable plasma more stable. As a starting point, the two values of $$P_G \left| \frac{\partial Z_T}{\partial P_G} \right|,$$

one for an unstable plasma and one for a stable plasma, are first ascertained (step 1602 and step 1604).

The value of $$P_G \left| \frac{\partial Z_T}{\partial P_G} \right|$$

for the stable plasma can be a measured value, or it can be a value chosen from within a range of values known to correspond to stable plasmas. The inventors believe that the value of $$P_G \left| \frac{\partial Z_T}{\partial P_G} \right|$$

for the stable plasma can be obtained for any suitable process, employing any gas at any suitable parameter settings. Once the target value $$P_G \left| \frac{\partial Z_T}{\partial P_G} \right|$$

for one or more stable plasmas is obtained a plasma processing system, the value $$P_G \left| \frac{\partial Z_T}{\partial P_G} \right|$$

for the process of interest can be reduced to the target value found, thereby resulting in a stable plasma for the process of interest.

The value of $$P_G \left| \frac{\partial Z_T}{\partial P_G} \right|$$

for the unstable plasma can be a measured value, or an extrapolated value, e.g., in cases where measurements may be difficult for unstable plasmas. For example, measurements of $$P_G \left| \frac{\partial Z_T}{\partial P_G} \right|$$

may be made at parameter settings where the plasmas are known to be stable, and these measurements may thereafter be extrapolated to obtain extrapolated values for $$P_G \left| \frac{\partial Z_T}{\partial P_G} \right|$$

at the parameter settings of interest.

The generator output power, $P_G$, is the known output power of the generator. In one embodiment, the value of $$\frac{\partial Z_T}{\partial P_G}$$

is measured by tuning the matching network with the generator output power at its nominal value. Once the matching network is so tuned, the matching network tuning element values are held fixed, and the generator output power $P_G$ is then varied.

Using an appropriate sensor, such as sensor 208 in FIG. 2, load impedance $Z_T$ as a function of $P_G$ may then be measured, and hence obtaining $$\frac{\partial Z_T}{\partial P_G}.$$

In another embodiment, the value of $$\frac{\partial Z_T}{\partial P_G}$$

is measured by tuning the matching network with generator output power at its nominal value. Once the matching network is so tuned, the matching network tuning element values are held fixed, and the generator output power $P_G$ is then varied. Using an appropriate sensor, such as sensor 210 in FIG. 2, the input impedance $Z_M$ of the impedance matching network is then measured, and hence obtaining $$\frac{\partial Z_M}{\partial P_G}.$$

Since $dZ_T$ and $dZ_M$ are related according to Equation A4, Equation A4 may be employed to transform $$\frac{\partial Z_M}{\partial P_G}$$

into $$\frac{\partial Z_T}{\partial P_G}.$$

Once values of $$P_G \left| \frac{\partial Z_T}{\partial P_G} \right|$$

have been determined for the unstable and target stable plasmas, the matching network tuned input impedance $Z_M$ for the unstable plasma may be reduced (step 1606) by the ratio of $$P_G \left| \frac{\partial Z_T}{\partial P_G} \right|$$

for the unstable plasma to $$P_G \left| \frac{\partial Z_T}{\partial P_G} \right|$$

for the stable plasma (see equations A6 or B5).

As mentioned earlier, the matching network may be tuned to any lower tuning point, with the additional resistance making up the difference, to obtain a stable plasma. For example, in one embodiment, the matching network input impedance is tuned to about 5Ω, which results in approximately 90% of the power "wasted" (assuming a 50Ω characteristic impedance for the RF transmission line). As another example, tuning the matching network input impedance to about 45Ω would result in approximately 10% of the power "wasted." As a further example, tuning the matching network input impedance to about 10Ω would result in approximately 80% of the power "wasted" while tuning the matching network input impedance to about 40Ω would result in approximately 20% of the power "wasted." Depending on the process recipe, the matching network input impedance can of course be tuned down to any desired value, with the additional resistance making up the difference, to achieve a stable plasma.

Thereafter, add enough resistance ($R_X$ in FIGS. 8A–8E or $R_Y$ in FIG. 9) to bring the input impedance of the "matching circuit" (which now comprises the additional resistor and the matching network) back up to the original value of the matching network, e.g., 50Ω. This is shown in step 1608.

If desired, the length of the RF transmission line (216 or 236 in FIG. 2) may be modified, in accordance with equation A6, to match the phase of $$\frac{\partial Z_T}{\partial P_G}$$

for the unstable plasma (with added resistor $R_X$) to the phase of $$\frac{\partial Z_T}{\partial P_G}$$

or the stable plasma (step 1610). In some cases, however, if the magnitude of $$P_G \left| \frac{\partial Z_T}{\partial P_G} \right|$$

is small enough, the system may be stable for all values of phase, in which case a change of the RF cable length may not be necessary.

For a particular RF generator, it is believed that the value of the complex quantity $$P_G \frac{\partial Z_T}{\partial P_G}$$

determine whether a given plasma will be stable or unstable. The ranges of values of $$P_G \frac{\partial Z_T}{\partial P_G}$$

that are stable or unstable depend on the characteristics of the generator, so that a value of $$P_G \frac{\partial Z_T}{\partial P_G}$$

that is unstable for a particular generator might be stable for a different generator.

In the past, it has been difficult to communicate with RF generator manufacturers the parameters or characteristics required in order to create an RF generator that produces stable plasmas for all processes of interest. One reason of this difficulty lies in the lack of understanding of the underlying cause of plasma instability. In fact, many things are still not fully understood by contemporary science about plasma in general. Another reason relates to the fact that it is difficult to quantify the parameters associate with RF generator design which affect plasma stability for processes of interest.

In accordance with one embodiment of the present invention, a technique is proposed to communicate and specify parameters to RF generator manufacturers so that if those parameters are satisfied, the resultant RF generator is likely to produce stable plasmas for processes of interest.

For a fixed RF cable length, a particular plasma can be represented as a point on a plot with an x-axis given by the real part of $$P_G \frac{\partial Z_T}{\partial P_G},$$

and y-axis given by the imaginary part of $$P_G \frac{\partial Z_T}{\partial P_G},$$

as shown in FIG. 17A. In accordance with one embodiment, all plasmas of interest (i.e., plasmas for all processes of interest) are plotted similarly, so that the coordinates of all the data points representing the value of $$P_G \frac{\partial Z_T}{\partial P_G}$$

for all plasmas of interest may be obtained.

A given RF generator also has a stable operating region, and a plot for the stable region may be measured experimentally or obtained from the RF generator manufacturer. An exemplary plot is shown in FIG. 17B for an exemplary RF generator. For this generator, plasmas that have values of $$P_G \frac{\partial Z_T}{\partial P_G}$$

within the shaded region will be stable. Plasmas that have values of $$P_G \frac{\partial Z_T}{\partial P_G}$$

outside of the shaded region will be unstable. In FIG. 17B, although the stable region is shown as an oval, it may in fact have any shape. In the case of FIG. 17B, the RF generator stable operating region has a central part (the cross-hatched region in FIG. 17C) that is always stable regardless of the phase of $$P_G \frac{\partial Z_T}{\partial P_G}.$$

A plasma point inside this region will be stable regardless of the RF cable length. The generator stable operating region of FIG. 17B has another part (the cross-hatched region in FIG. 17D) that is stable for some values of the phase of $$P_G \frac{\partial Z_T}{\partial P_G}$$

and not stable for other values. Finally, the generator has a region (the cross hatched area of FIG. 17E) for which all points are unstable, regardless of phase. Other RF generators may have analogous regions, albeit they may differ in shapes and sizes from those shown in FIGS. 17B–17E.

By comparing the plot of FIG. 17B, representing the stable operating region for the RF generator and the plot of all the data points representing the value of $$P_G \frac{\partial Z_T}{\partial P_G}$$

for all plasmas of interest, it is possible to predict whether the RF generator would produce stable plasmas for all processes of interest.

Further, the plot of all the data points representing the value of $$P_G \frac{\partial Z_T}{\partial P_G}$$

for all plasmas of interest can serve as a specification for a generator. The specification would be that the generator have a stable region, as in FIG. 17B, that encompasses all of the data points representing the value of $$P_G \frac{\partial Z_T}{\partial P_G}$$

for all plasmas of interest. This information would then be employed by the RF generator manufacturer to design an RF generator that would produce stable plasmas for all processes of interest.

If necessary, the RF manufacturer may indicate that if the phases of the data points are rotated by a certain amount (e.g., by changing the length of the RF transmission line), the stable region of a furnished RF generator would in fact encompass the data points representing the value of $$P_G \frac{\partial Z_T}{\partial P_G}$$

for all plasmas of interest (after the phase rotation). The exact value of the phase rotation may be determined mathematically or empirically. This information would then be employed by the designer of the RF power system in choosing the correct length for the RF transmission line so that stable plasmas may be achieved with the finished RF generator for all processes of interest.

Appendix A. Calculation of $|DZ_T/DZ_M|$ for AN RF Cable to Show Effect of RF Cable Length on the Impedance Derivatives From Equation 1:

$$Z_T = R_0 \frac{Z_M + jR_0 \tan(2\pi L/\lambda)}{R_0 + jZ_M \tan(2\pi L/\lambda)} \qquad \text{Equation A1}$$

Equation A1 may be rewritten as Equation A2:

$$Z_T = R_0 \frac{Z_M + jR_0 \tan(2\pi L/\lambda)}{R_0 + jZ_M \tan(2\pi L/\lambda)}$$

$$= R_0 (Z_M + jR_0 \tan\theta)(R_0 + jZ_M \tan\theta)^{-1}$$

where $$\theta \equiv 2\pi L/\lambda$$

L is the length of the transmission line, and $\lambda$ is the wavelength of the RF in the transmission line.

$$\frac{dZ_T}{dZ_M} = R_0(R_0 + jZ_M \tan\theta)^{-1} + \qquad \text{Equation A3}$$

$$R_0(Z_M + jR_0 \tan\theta)(-1)(j\tan\theta)(R_0 + jZ_M \tan\theta)^{-2}$$

$$= \frac{R_0}{(R_0 + jZ_M \tan\theta)} \left[ 1 - \frac{j\tan\theta(Z_M + jR_0 \tan\theta)}{(R_0 + jZ_M \tan\theta)} \right]$$

$$= \frac{R_0^2(1 + \tan^2\theta)}{(R_0 + jZ_M \tan\theta)^2}$$

At the tune point, $Z_M = R_0$, and $$\frac{dZ_T}{dZ_M} = \frac{(1 + \tan^2\theta)}{(1 + j\tan\theta)^2} \qquad \text{Equation A4}$$

$$\left|\frac{dZ_T}{dZ_M}\right| = 1 \quad \text{Equation A5}$$

$$\text{Argument}\left(\frac{dZ_T}{dZ_M}\right) = -2\theta \quad \text{Equation A6}$$

In other words, as shown by Equation A5, the length of a lossless transmission line does not change the magnitude of the impedance derivatives, when the terminating resistance $R_M$ is equal to the transmission line characteristic resistance $R_0$. The phase may be changed at the two ends of the cable ($Z_M$ vs. $Z_T$ across the RF cable) but the magnitude of the change (i.e., the derivative) is the same (e.g., a 1Ω change to $Z_M$ results in a 1Ω increase or decrease in $Z_T$ without changing the magnitude of the change).

Appendix B, Calculation of L-match $dZ_M/dZ_S$

For the L-match network of FIG. 14

$$Z_M = \frac{Z_2 Z_3}{Z_2 + Z_3} \quad \text{Equation B1}$$

where $Z_2=jX_2$ is the shunt impedance and $Z_3=R_S+jX_3$ is the sum of several impedances, including the effective series plasma impedance $Z_S$. Differentiating gives:

$$\frac{dZ_M}{dZ_3} = Z_2[(Z_2+Z_3)^{-1} - Z_3(Z_2+Z_3)^{-2}] \quad \text{Equation B2}$$

$$= \frac{Z_2^2}{(Z_2+Z_3)^2}$$

$$= \frac{j^2 X_2^2}{[R_S + j(X_2+X_3)]^2}$$

$$\frac{dZ_M}{dZ_3} = \frac{dZ_M}{dZ_S}$$

because $Z_S$ is the only part of $Z_3$ that varies on the time scales of interest (i.e., faster than the response time of the match circuit and therefore the match capacitors can be assumed to be fixed).

The conditions for $Z_M$ to be equal to $R_M$ and for $X_M$ to be equal to 0 are:

$$X_3 = \pm sqrt(R_M R_S - R_S^2) \quad \text{Equation B3}$$

$$X_2 = \frac{\mu R_M R_S}{sqrt(R_M R_S - R_S^2)}$$

At the tune point, for either + or − solution:

$$\frac{dZ_M}{dZ_S} = \frac{\frac{-R_M^2 R_S^2}{R_M R_S - R_S^2}}{\left[R_S + j\left(\frac{R_S^2}{\sqrt{R_M R_S - R_S^2}}\right)\right]^2} \quad \text{Equation B4}$$

$$= \frac{-R_M^2}{R_M R_S - 2R_S^2 + 2jR_S\sqrt{R_M R_S - R_S^2}}$$

$$= \frac{-r_S + 2r_S^2 + 2jr_S\sqrt{r_S - r_S^2}}{(r_S - 2r_S^2) + 4r_S^2(r_S - r_S^2)}; \quad r_S \equiv R_S/R_M$$

$$= \frac{-r_S + 2r_S^2 + 2jr_S\sqrt{r_S - r_S^2}}{r_S^2}$$

$$= \frac{1}{r_S} + 2 + 2j\sqrt{\frac{1}{r_S} - 1}$$

$$= 2 - \frac{R_0}{R_S} + 2j\sqrt{\frac{R_M}{R_S} - 1} \quad \text{and}$$

$$\left|\frac{dZ_M}{dZ_S}\right| = sqrt\left[\left(2 - \frac{R_M}{R_S} + 2j\sqrt{\frac{R_M}{R_S} - 1}\right)\left(2 - \frac{R_M}{R_S} + 2j\sqrt{\frac{R_0}{R_S} - 1}\right)\right] \quad \text{Equation B5}$$

$$= sqrt\left(\frac{R_M^2}{R_S^2} - 4\frac{R_M}{R_S} + 4 + 4\frac{R_M}{R_S} - 4\right)$$

$$= \frac{R_M}{R_S}$$

Thus, the same magnification factor that the matching network applies on the real part of the plasma impedance, $R_S$, also magnifies the impedance derivatives by the same magnification factor. Any percentage change in $R_S$ will result in the same percentage change in the impedance derivative.

Thus, to reduce $$\left|\frac{dZ_M}{dZ_S}\right|,$$

one can either reduce $R_M$ or increases $R_S$.

Appendix C, Calculation of T-match $dZ_M/dZ_S$

FIG. 15 is a schematic diagram of a T-match, the impedance $Z_3$ includes capacitors $C_c$ and $C_d$, the TCP coil, and the series equivalent plasma load impedance $Z_S$.

$$Z_M = Z_1 + \frac{Z_2 Z_3}{Z_2 + Z_3} \quad \text{Equation C1}$$

where $Z_1=jX_1$ and $Z_2=jX_2$ are two of the match capacitors, and $Z_3=R_S+jX_3$, where $R_S$ is the real part of the series equivalent plasma load impedance. Because we are interested in high-frequency instabilities, $Z_1$ can be considered to be fixed at its tune point. Differentiating gives Equation C2:

$$\frac{dZ_M}{dZ_3} = Z_2[(Z_2+Z_3)^{-1} - Z_3(Z_2+Z_3)^{-2}]$$

$$= \frac{Z_2^2}{(Z_2+Z_3)^2}$$

-continued $$= \frac{j^2 X_2^2}{[R_S + j(X_2 + X_3)]^2}$$

$$\frac{dZ_M}{dZ_3} = \frac{dZ_M}{dZ_S}$$

because $Z_S$ is the only part of $Z_3$ that varies on the time scales of interest.

The conditions for $Z_M$ to be equal to $R_M$ and for $X_M$ to be equal to 0 are:

$$X_3 = -X_2 \pm \sqrt{\frac{X_2^2 R_S}{R_M} - R_S^2} \qquad \text{Equation C3}$$

$$X_1 = -X_2 \pm \sqrt{\frac{X_2^2 R_M}{R_S} - R_M^2}$$

Substituting the above value of $X_3$ into equation C2 gives the derivative of the match input impedance with respect to the series equivalent plasma load impedance when $Z_M = R_M$ and $X_M = 0$:

$$\frac{dZ_M}{dZ_S} = \frac{-X_2^2}{R_S^2 \pm 2jR_S\sqrt{\frac{X_2^2 R_S}{R_M} - R_S^2} - \left(\frac{X_2^2 R_S}{R_M} - R_S^2\right)} \qquad \text{Equation C4}$$

$$= \frac{-X_2^2}{2R_S^2 - \frac{X_2^2 R_S}{R_M} \pm 2jR_S\sqrt{\frac{X_2^2 R_S}{R_M} - R_S^2}}$$

$$= \frac{-X_2^2 \left(2R_S^2 - \frac{X_2^2 R_S}{R_M} \mu 2jR_S \sqrt{\frac{X_2^2 R_S}{R_M} - R_S^2}\right)}{\left(2R_S^2 - \frac{X_2^2 R_S}{R_M}\right)^2 + 4R_S^2\left(\frac{X_2^2 R_S}{R_M} - R_S^2\right)}$$

$$= \frac{-R_0^2}{X_2^2 R_S^2} \left(2R_S^2 - \frac{X_2^2 R_S}{R_M} \mu 2jR_S\sqrt{\frac{X_2^2 R_S}{R_M} - R_S^2}\right)$$

$$= \frac{-2R_M^2}{X_2^2} + \frac{R_M}{R_S} \pm 2j\frac{R_M^2}{X_2^2}\sqrt{\frac{X_2^2}{R_M R_S} - 1}$$

$$\left|\frac{dZ_M}{dZ_S}\right|^2 = \frac{4R_M^4}{X_2^4} - \frac{4R_M^2}{X_2^2}\frac{R_M}{R_S} + \frac{R_M^2}{R_S^2} + \qquad \text{Equation C5}$$

$$\frac{4R_M^4}{X_2^4}\left(\frac{X_2^2}{R_M R_S} - 1\right)$$

$$= \frac{R_M^2}{R_S^2}$$

$$\left|\frac{dZ_M}{dZ_S}\right| = \frac{R_M}{R_S} \qquad \text{Equation C6}$$

This is the same result as for the L-match, equation B5. Again, the same magnification factor that the matching network applies on the real part of the plasma impedance, $R_S$, also magnifies the impedance derivatives by the same magnification factor. Again, to reduce $$\left|\frac{dZ_M}{dZ_S}\right|,$$

one can either reduce $R_M$ or increases $R_S$.

It should be noted that the same result is also obtained for the Π-match network For brevity's sake, the arithmetic is not repeated here.

Thus, while this invention has been described in terms of several preferred embodiments, there are alterations, permutations, and equivalents which fall within the scope of this invention. For example, although the impedance elements in the match networks are shown to be capacitors, it should be understood that such impedance elements may also be implemented by inductors and/or a combination of inductors and capacitor (both fixed and variable). As a further example, a separate terminating capacitor $C_d$ (such as that shown in FIG. 9) may not be required on all chamber configurations.

As yet another example, although the top RF electrode has been discussed as the RF electrode in the exemplary RF power system, it should be understood that the invention also applies when the electrode is primarily capacitive, such as a bias electrode or an electrode in a capacitively coupled plasma system. Furthermore, some components may be optional and other optional and/or conventional components may be omitted from the figures. As the components are shown, indicated, or mentioned as being coupled together, it should be understood that these components may in some cases be physically connected, and in other cases, may simply be in the same current path, with one or more components disposed in between.

Furthermore, although the exemplary RF power arrangements discussed herein are disclosed to have an RF transmission line, such RF transmission line is not absolutely required to practice the invention. For example, some integrated RF power arrangements may not require the use of an RF transmission line to couple the matching network to the RF generator. Instead, these integrated RF power arrangements may directly couple the RF generator output to the matching network, and in some cases, the matching network directly connected to the RF load (such as the RF antenna or RF electrode). Irrespective whether the RF transmission cable is present, the use of the additional resistance and/or power attenuator to reduce the load impedance with respect to power and to achieve improved plasma stability would still apply. Additionally, it is also possible to employ the present invention to communicate the plama stability requirement to the manufacturer of such integrated RF power arrangements and to furnish the manufacturer with an efficient way to determine whether a particular RF generator and/or matching network would satisfy the requirement with respect to plasma stability.

It should also be noted that there are many alternative ways of implementing the methods and apparatuses of the present invention. It is therefore intended that the following appended claims be interpreted as including all such alterations, permutations, and equivalents as fall within the true spirit and scope of the present inventions.

What is claimed is:

1. A plasma processing system for processing semiconductor substrates, comprising:
   an RF generator having an RF generator output;
   an RF transmission line coupled to said RF generator output, said RF transmission line having a characteristic impedance; and
   a matching circuit coupled to said RF transmission line, said matching circuit having a first resistor and a matching network, said matching network having a plurality of impedance devices, wherein said first resistor is coupled to at least one terminal of one of said plurality of impedance devices, and wherein an input impedance of said matching circuit is substantially equal to said characteristic impedance of said RF transmission line.

2. The plasma processing system of claim 1 wherein said first resistor is a discrete resistor.

3. The plasma processing system of claim 1 wherein said first resistor is inherently implemented by a low conductance material in one of an inductive element in said matching network and a connector in said plasma processing system.

4. The plasma processing system of claim 3 wherein low conductance material is one of stainless steel, nichrome, chromel, graphite, and SiC.

5. The plasma processing system of claim 1 wherein said matching network is a π-match network.

6. The plasma processing system of claim 5 wherein said π-match network has a first T-junction and a second T-junction, said first T-junction being coupled to a first impedance device and a second impedance device of said plurality of impedance devices and to an input terminal of said π-match network, said second T-junction being coupled to a third impedance device and said second impedance device of said plurality of impedance devices and to an output terminal of said π-match network, said first impedance device and said third impedance device also being coupled to ground, said second device being coupled in series between said first T-junction and said second T-junction, said first resistor being coupled in series between said second T-junction and said third impedance device.

7. The plasma processing system of claim 5 wherein said π-match network has a first T-junction and a second T-junction, said first T-junction being coupled to a first impedance device and a second impedance device of said plurality of impedance devices and to an input terminal of said π-match network, said second T-junction being coupled to a third impedance device and said second impedance device of said plurality of impedance devices and to an output terminal of said π-match network, said first impedance device and said third impedance device also being coupled to ground, said second device being coupled in series between said first T-junction and said second T-junction, said first resistor being coupled in series between said third impedance device and said ground.

8. The plasma processing system of claim 5 wherein said π-match network has a first T-junction and a second T-junction, said first T-junction being coupled to a first impedance device and a second impedance device of said plurality of impedance devices and to an input terminal of said π-match network, said second T-junction being coupled to a third impedance device and said second impedance device of said plurality of impedance devices and to an output terminal of said π-match network, said first impedance device and said third impedance device also being coupled to ground, said second device being coupled in series between said first T-junction and said second T-junction, said first resistor being coupled in series between said second impedance device and said second T-junction.

9. The plasma processing system of claim 5 wherein said π-match network has a first T-junction and a second T-junction, said first T-junction being coupled to a first impedance device and a second impedance device of said plurality of impedance devices and to an input terminal of said π-match network, said second T-junction being coupled to a third impedance device and said second impedance device of said plurality of impedance devices and to an output terminal of said π-match network, said first impedance device and said third impedance device also being coupled to ground, said second device being coupled in series between said first T-junction and said second T-junction, said first resistor being coupled in series between said second impedance device and said first T-junction.

10. The plasma processing system of claim 5 wherein said π-match network has a first T-junction and a second T-junction, said first T-junction being coupled to a first impedance device and a second impedance device of said plurality of impedance devices and to an input terminal of said π-match network, said second T-junction being coupled to a third impedance device and said second impedance device of said plurality of impedance devices and to an output terminal of said π-match network, said first impedance device and said third impedance device also being coupled to ground, said second device being coupled in series between said first T-junction and said second T-junction, said first resistor being coupled in series between said first impedance device and said first T-junction.

11. The plasma processing system of claim 5 wherein said π-match network has a first T-junction and a second T-junction, said first T-junction being coupled to a first impedance device and a second impedance device of said plurality of impedance devices and to an input terminal of said π-match network, said second T-junction being coupled to a third impedance device and said second impedance device of said plurality of impedance devices and to an output terminal of said π-match network, said first impedance device and said third impedance device also being coupled to ground, said second device being coupled in series between said first T-junction and said second T-junction, said first resistor being coupled in series between said first impedance device and said ground.

12. The plasma processing system of claim 1 wherein said matching network is a T-match network.

13. The plasma processing system of claim 12 wherein said T-match network has a first T-junction, a first impedance device of said plurality of impedance devices being coupled between said first T-junction and an input terminal of said T-match network, a second impedance device of said plurality of impedance devices being coupled between said first T-junction and ground, a third impedance device of said plurality of impedance devices being coupled between said first T-junction and an output terminal of said T-match network, said first resistor being coupled between said first impedance device and said first T-junction.

14. The plasma processing system of claim 12 wherein said T-match network has a first T-junction, a first impedance device of said plurality of impedance devices being coupled between said first T-junction and an input terminal of said T-match network, a second impedance device of said plurality of impedance devices being coupled between said first T-junction and ground, a third impedance device of said plurality of impedance devices being coupled between said first T-junction and an output terminal of said T-match network, said first resistor being coupled between said first T-junction and said second impedance device.

15. The plasma processing system of claim 12 wherein said T-match network has a first T-junction, a first impedance device of said plurality of impedance devices being coupled between said first T-junction and an input terminal of said T-match network, a second impedance device of said plurality of impedance devices being coupled between said first T-junction and ground, a third impedance device of said plurality of impedance devices being coupled between said first T-junction and an output terminal of said T-match network, said first resistor being coupled between said second impedance device and ground.

16. The plasma processing system of claim 1 wherein at least one of said plurality of impedance devices is a capacitor.

17. The plasma processing system of claim 1 wherein at least one of said plurality of impedance devices is an inductor.

18. The plasma processing system of claim 1 wherein said first resistor is fixed.

19. The plasma processing system of claim 1 wherein said first resistor is variable.

20. The plasma processing system of claim 1 wherein said first resistor is switched, a resistance value across an input terminal of said resistor and an output terminal of said resistor having a first value when in a first state, said resistance value across said input terminal and said output terminal of said first resistor having a second value when in a second state.

21. The plasma processing system of claim 20 wherein said first value is substantially zero.

22. The plasma processing system of claim 1 wherein said first resistor is liquid-cooled.

23. The plasma processing system of claim 1 further comprising a chamber, said chamber being configured to generate inductively-coupled plasma.

24. The plasma processing system of claim 1 further comprising a chamber, said chamber being configured to generate capacitively-coupled plasma.

25. The plasma processing system of claim 1 wherein said first resistor is in series with an input of said matching network, an input impedance of said matching network is lower than said characteristic impedance of said RF transmission line.

26. The plasma processing system of claim 25 wherein said matching network is a T-match network.

27. The plasma processing system of claim 26 wherein said first resistor is coupled in series between said RF transmission line and an input terminal of said T-match network.

28. The plasma processing system of claim 26 wherein said T-match network has a first T-junction, a first impedance device of said plurality of impedance devices being coupled between said first T-junction and an input terminal of said T-match network, a second impedance device of said plurality of impedance devices having two terminals, a first one of said two terminals of said second impedance device being coupled to said first T-junction, a third impedance of said plurality of impedance being coupled between said first T-junction and an output terminal of said T-match network, said first resistor having a first resistor terminal and a second resistor terminal, said first resistor terminal being coupled to a second one of said two terminals of said second impedance device, said second resistor terminal being coupled to ground.

29. The plasma processing system of claim 24 wherein said first resistor is a discrete resistor.

30. The plasma processing system of claim 26 wherein said first resistor is inherently implemented by a low conductance material in one of an inductive element in said matching network and a connector in said plasma processing system.

31. The plasma processing system of claim 30 wherein low conductance material is one of stainless steel, nichrome, chromel, graphite, and SiC.

32. The plasma processing system of claim 26 wherein at least one of said plurality of impedance devices is a capacitor.

33. The plasma processing system of claim 26 wherein at least one of said plurality of impedance devices is an inductor.

34. The plasma processing system of 26 wherein said a resistance value of said first resistor is between 10% and 90% of an impedance value of said input impedance of said matching circuit.

35. The plasma processing system of 26 wherein said a resistance value of said first resistor is between 20% and 80% of an impedance value of said input impedance of said matching circuit.

36. The plasma processing system of claim 26 wherein said first resistor is fixed.

37. The plasma processing system of claim 26 wherein said first resistor is variable.

38. The plasma processing system of claim 26 wherein said first resistor is switched, a resistance value across an input terminal of said resistor and an output terminal of said resistor having a first value when in a first state, said resistance value across said input terminal and said output terminal of said first resistor having a second value when in a second state.

39. The plasma processing system of claim 26 wherein said first value is substantially zero.

40. The plasma processing system of claim 26 wherein said first resistor is liquid-cooled.

41. The plasma processing system of claim 26 further comprising a chamber, said chamber being configured to generate inductively-coupled plasma.

42. The plasma processing system of claim 26 further comprising a chamber, said chamber being configured to generate capacitively-coupled plasma.

43. The plasma processing system of claim 25 wherein said matching network is an L-match network.

44. The plasma processing system of claim 43 wherein first resistor is coupled between said RF transmission line and an input terminal of said L-match network.

45. The plasma processing system of claim 43 wherein said L-match network has a first impedance device having two terminals, a first one of said two terminals of said first impedance device being coupled to an input terminal of said L-match network, said second impedance device being coupled between said input terminal of said L-match network and a load, said first resistor being coupled between a second one of said two terminals of said first impedance device and ground.

46. The plasma processing system of claim 43 wherein said first resistor is inherently implemented by a low conductance material in one of an inductive element in said matching network and a connector in said plasma processing system.

47. The plasma processing system of claim 46 wherein low conductance material is one of stainless steel, nichrome, chromel, graphite, and SiC.

48. The plasma processing system of claim 43 wherein at least one of said plurality of impedance devices is a capacitor.

49. The plasma processing system of claim 43 wherein at least one of said plurality of impedance devices is an inductor.

50. The plasma processing system of 43 wherein said a resistance value of said first resistor is between 10% and 90% of an impedance value of said input impedance of said matching circuit.

51. The plasma processing system of 43 wherein said a resistance value of said first resistor is between 20% and 80% of an impedance value of said input impedance of said matching circuit.

52. The plasma processing system of claim 43 wherein said first resistor is fixed.

53. The plasma processing system of claim 43 wherein said first resistor is variable.

54. The plasma processing system of claim 43 wherein said first resistor is switched, a resistance value across an input terminal of said resistor and an output terminal of said resistor having a first value when in a first state, said resistance value across said input terminal and said output terminal of said first resistor having a second value when in a second state.

55. The plasma processing system of claim 54 wherein said first value is substantially zero.

56. The plasma processing system of claim 43 wherein said first resistor is liquid-cooled.

57. The plasma processing system of claim 43 further comprising a chamber, said chamber being configured to generate inductively-coupled plasma.

58. The plasma processing system of claim 43 further comprising a chamber, said chamber being configured to generate capacitively-coupled plasma.

59. The plasma processing system of claim 43 wherein said first resistor is in series with an input of said matching network, an input impedance of said matching network is lower than said characteristic impedance of said RF transmission line, said matching network is an L-match network, and said first resistor is a discrete resistor.

60. The plasma processing system of claim 25 wherein said matching network is a π-match network.

61. The plasma processing system of claim 60 wherein said first resistor is coupled in series between said RF transmission line and an input terminal of said π-match network.

62. The plasma processing system of claim 60 wherein said first resistor is a discrete resistor.

63. The plasma processing system of claim 60 wherein said first resistor is inherently implemented by a low conductance material in one of an inductive element in said matching network and a connector in said plasma processing system.

64. The plasma processing system of claim 63 wherein low conductance material is one of stainless steel, nichrome, chromel, graphite, and SiC.

65. The plasma processing system of claim 60 wherein at least one of said plurality of impedance devices is a capacitor.

66. The plasma processing system of claim 60 wherein at least one of said plurality of impedance devices is an inductor.

67. The plasma processing system of 60 wherein said a resistance value of said first resistor is between 10% and 90% of an impedance value of said input impedance of said matching circuit.

68. The plasma processing system of claim 60 wherein said a resistance value of said first resistor is between 20% and 80% of an impedance value of said input impedance of said matching circuit.

69. The plasma processing system of claim 60 wherein said first resistor is fixed.

70. The plasma processing system of claim 60 wherein said first resistor is variable.

71. The plasma processing system of claim 60 wherein said first resistor is switched, a resistance value across an input terminal of said resistor and an output terminal of said resistor having a first value when in a first state, said resistance value across said input terminal and said output terminal of said first resistor having a second value when in a second state.

72. The plasma processing system of claim 71 wherein said first value is substantially zero.

73. The plasma processing system of claim 60 wherein said first resistor is liquid-cooled.

74. The plasma processing system of claim 60 further comprising a chamber, said chamber being configured to generate inductively-coupled plasma.

75. The plasma processing system of claim 60 further comprising a chamber, said chamber being configured to generate capacitively-coupled plasma.

76. The plasma processing system of claim 1 wherein said first resistor is in series with an equivalent plasma impedance that exists during said processing.

77. The plasma processing system of claim 76 wherein said first resistor is coupled in series between an output of said matching network and said equivalent plasma impedance.

78. The plasma processing system of claim 76 wherein said first resistor is inherently implemented by a low conductance material in one of an inductive element in said matching network and a connector in said plasma processing system.

79. The plasma processing system of claim 76 wherein said first resistor is coupled in series between an RF antenna inductance $L_A$ and a terminating capacitor $C_d$.

80. The plasma processing system of claim 76 wherein said first resistor is coupled in series between a terminating capacitor $C_d$ and ground.

81. The plasma processing system of claim 76 wherein said matching network is a T-match network.

82. The plasma processing system of claim 81 wherein said first resistor disposed in series between a terminating capacitor $C_d$ and ground.

83. The plasma processing system of claim 81 wherein said first resistor is disposed in one of a first position and a second position, said first position is disposed in series between an output of said matching network and said equivalent plasma impedance, said second position is disposed in series between an RF antenna inductance $L_A$ and a terminating capacitor $C_d$.

84. The plasma processing system of claim 81 wherein said first resistor is a discrete resistor.

85. The plasma processing system of claim 81 wherein said first resistor is inherently implemented by a low conductance material in one of an inductive element in said matching network and a connector in said plasma processing system.

86. The plasma processing system of claim 85 wherein low conductance material is one of stainless steel, nichrome, chromel, graphite, and SiC.

87. The plasma processing system of claim 81 wherein at least one of said plurality of impedance devices is a capacitor.

88. The plasma processing system of claim 81 wherein at least one of said plurality of impedance devices is an inductor.

89. The plasma processing system of 81 wherein said a resistance value of said first resistor is between about 10% and about 90% of a resistance sum value, said resistance sum value equals said resistance value of said first resistor plus a series equivalent plasma load resistance in a plasma processing chamber of said plasma processing system during processing.

90. The plasma processing system of 81 wherein said a resistance value of said first resistor is between 20% and 80% of a resistance sum value, said resistance sum value equals said resistance value of said first resistor plus a series equivalent plasma load resistance in a plasma processing chamber of said plasma processing system during processing.

91. The plasma processing system of claim 81 wherein said first resistor is fixed.

92. The plasma processing system of claim 81 wherein said first resistor is variable.

93. The plasma processing system of claim 92 wherein said first resistor is switched, a resistance value across an input terminal of said resistor and an output terminal of said resistor having a first value when in a first state, said resistance value across said input terminal and said output terminal of said first resistor having a second value when in a second state.

94. The plasma processing system of claim 93 wherein said first value is substantially zero.

95. The plasma processing system of claim 92 wherein said first resistor is switched, a resistance value across an input terminal of said resistor and an output terminal of said resistor having a first value when in a first state, said resistance value across said input terminal and said output terminal of said first resistor having a second value when in a second state.

96. The plasma processing system of claim 92 wherein said first resistor is switched, a resistance value across an input terminal of said resistor and an output terminal of said resistor having a first value when in a first state, said resistance value across said input terminal and said output terminal of said first resistor having a second value when in a second state.

97. The plasma processing system of claim 81 wherein said first resistor is liquid-cooled.

98. The plasma processing system of claim 81 further comprising a chamber, said chamber being configured to generate inductively-coupled plasma.

99. The plasma processing system of claim 81 further comprising a chamber, said chamber being configured to generate capacitively-coupled plasma.

100. The plasma processing system of claim 76 wherein said matching network is an L-match network.

101. The plasma processing system of claim 100 wherein said first resistor is coupled to a first impedance device of said L-match network, a second impedance device of said L-match, and an input of said L-match network.

102. The plasma processing system of claim 100 wherein said first resistor is disposed in one of a first position, a second position, and a third position, said first position is disposed in series between an output of said L-match network and said equivalent plasma impedance, said second position is disposed in series between an RF antenna inductance $L_A$ and a terminating capacitor $C_d$, said third position is disposed in series between said terminating capacitor $C_d$ and ground.

103. The plasma processing system of claim 100 wherein said first resistor is a discrete resistor.

104. The plasma processing system of claim 100 wherein said first resistor is inherently implemented by a low conductance material in one of an inductive element in said matching network and a connector in said plasma processing system.

105. The plasma processing system of claim 104 wherein low conductance material is one of stainless steel, nichrome, chromel, graphite, and SiC.

106. The plasma processing system of claim 104 wherein low conductance material is one of stainless steel, nichrome, chromel, graphite, and SiC.

107. The plasma processing system of claim 100 wherein at least one of said plurality of impedance devices is a capacitor.

108. The plasma processing system of claim 100 wherein at least one of said plurality of impedance devices is an inductor.

109. The plasma processing system of 100 wherein said a resistance value of said first resistor is between about 10% and about 90% of a resistance sum value, said resistance sum value equals said resistance value of said first resistor plus a series equivalent plasma load resistance in a plasma processing chamber of said plasma processing system during processing.

110. The plasma processing system of claim 100 wherein said a resistance value of said first resistor is between 20% and 80% of a resistance sum value, said resistance sum value equals said resistance value of said first resistor plus a series equivalent plasma load resistance in a plasma processing chamber of said plasma processing system during processing.

111. The plasma processing system of claim 100 wherein said first resistor is fixed.

112. The plasma processing system of claim 100 wherein said first resistor is variable.

113. The plasma processing system of claim 100 wherein said first value is substantially zero.

114. The plasma processing system of claim 95 wherein said first resistor is liquid-cooled.

115. The plasma processing system of claim 100 further comprising a chamber, said chamber being configured to generate inductively-coupled plasma.

116. The plasma processing system of claim 100 farther comprising a chamber, said chamber being configured to generate capacitively-coupled plasma.

117. The plasma processing system of claim 76 wherein said matching network is an π-match network.

118. The plasma processing system of claim 117 wherein said first resistor is disposed in series between a terminating capacitor $C_d$ and ground.

119. The plasma processing system of claim 117 wherein said first resistor is disposed in one of a first position, and a second position, said first position is disposed in series between an output of said π-match network and said equivalent plasma impedance, said second position is disposed in series between an RF antenna inductance $L_A$ and a terminating capacitor $C_d$.

120. The plasma processing system of claim 117 wherein said first resistor is a discrete resistor.

121. The plasma processing system of claim 117 wherein said first resistor is inherently implemented by a low conductance material in one of an inductive element in said matching network and a connector in said plasma processing system.

122. The plasma processing system of claim 121 wherein at least one of said plurality of impedance devices is a capacitor.

123. The plasma processing system of claim 117 wherein at least one of said plurality of impedance devices is an inductor.

124. The plasma processing system of claim 117 wherein said a resistance value of said first resistor is between about 10% and about 90% of a resistance sum value, said resistance sum value equals said resistance value of said first resistor plus a series equivalent plasma load resistance in a plasma processing chamber of said plasma processing system during processing.

125. The plasma processing system of claim 117 wherein said a resistance value of said first resistor is between 20% and 80% of a resistance sum value, said resistance sum value equals said resistance value of said first resistor plus a series equivalent plasma load resistance in a plasma processing chamber of said plasma processing system during processing.

126. The plasma processing system of claim 117 wherein said first resistor is fixed.

127. The plasma processing system of claim 117 wherein said first resistor is variable.

128. The plasma processing system of claim 117 wherein said first value is substantially zero.

129. The plasma processing system of claim 117 wherein said first resistor is liquid-cooled.

130. The plasma processing system of claim 117 further comprising a chamber, said chamber being configured to generate inductively-coupled plasma.

131. The plasma processing system of claim 117 further comprising a chamber, said chamber being configured to generate capacitively-coupled plasma.

132. The plasma processing system of claim 1 wherein said first resistor is in series with an equivalent plasma impedance that exists during said processing, said matching network is a T-match network having a first T-junction, a first impedance device of said plurality of impedance devices being coupled between said first T-junction and an input terminal of said T-match network, a second impedance device of said plurality of impedance devices being coupled between said first T-junction and ground, a third impedance of said plurality of impedance being coupled between said first T-junction and an output terminal of said T-match network, said first resistor being coupled in series between said first T-junction and said third impedance device.

133. The plasma processing system of claim 1 wherein said L-match network has a first impedance device and a second impedance device, said first impedance device having two terminals, a first one of said two terminals of said first impedance device being coupled to ground, said second impedance device being coupled between said input terminal of said L-match network and a load, said first resistor having a first resistor terminal and a second resistor terminal, said first resistor terminal being coupled to a second one of said two terminals of said first impedance device, said second resistor terminal being coupled to said input terminal of said L-match network.

134. The plasma processing system of claim 1 wherein said L-match network has a first impedance device and a second impedance device, said first impedance device having two terminals, a first one of said two terminals of said first impedance device being coupled to an input terminal of said L-match network, said second impedance device being coupled between said input terminal of said L-match network and a load, said first resistor having a first resistor terminal and a second resistor terminal, said first resistor terminal being coupled to a second one of said two terminals of said first impedance device, said second resistor terminal being coupled to ground.

135. The plasma processing system of claim 43 wherein said first resistor is in series with an input of said matching network, an input impedance of said matching network is lower than said characteristic impedance of said RF transmission line, said matching network is an L-match network, and said first resistor is a discrete resistor.

136. The plasma processing system of claim 135 wherein said RF power attenuator comprises resistors arranged in a T configuration.

137. The plasma processing system of claim 135 wherein said RF power attenuator comprises resistors arranged in a π configuration.

138. The plasma processing system of claim 135 wherein said RF power attenuator is one of an L attenuator, an H attenuator, an O attenuator, a bridged T attenuator, and a bridged H attenuator.

139. The plasma processing system of 135 wherein said RF power attenuator attenuates between 10% and 90% of RF power outputted by said RF generator.

140. The plasma processing system of 135 wherein said RF power attenuator attenuates between 20% and 80% of RF power outputted by said RF generator.

141. The plasma processing system of claim 135 wherein said RF power attenuator is disposed between said first RF transmission line and said matching network.

142. The plasma processing system of claim 141 wherein said matching network is coupled to said RF power attenuator.

143. The plasma processing system of claim 141 wherein said first RF transmission line is coupled to said RF generator.

144. The plasma processing system of claim 143 further comprising a second RF transmission line having a first end and a second end, said first end being coupled to said matching network, said second end being coupled with a terminal of said RF power attenuator, another terminal of said RF power attenuator being coupled to said first RF transmission line.

145. The plasma processing system of claim 135 wherein said first RF power attenuator is disposed between said RF generator and said RF transmission line, said first RF transmission line being coupled to said matching network.

146. The plasma processing system of claim 135 further comprising a chamber, wherein the RF power is inductively coupled to a plasma within said chamber.

147. The plasma processing system of claim 135 further comprising a chamber, wherein the RF power is capacitively coupled to a plasma within said chamber.

148. A method for configuring a plasma processing system, said plasma processing system being configured for processing semiconductor substrates, comprising:

providing an RF power arrangement including
an RF generator having an RF generator output,
a first RF transmission line coupled to receive RF current from said RF generator output during operation, said first RF transmission line having a characteristic impedance,
a matching network having an input impedance substantially equal to said characteristic impedance of said first RF transmission line, said matching network being configured to receive said RF current from said RF generator through said first RF transmission line; and coupling an RF power attenuator in a current path between said RF generator and said matching network.

149. The method of claim 148 wherein said RF power attenuator comprises resistors arranged in a T configuration.

150. The method of claim 148 wherein said RF power attenuator comprises resistors arranged in a π configuration.

151. The method of claim 148 wherein said RF power attenuator is one of an L attenuator, an H attenuator, an O attenuator, a bridged T attenuator, and a bridged H attenuator.

152. The method of 148 wherein said RF power attenuator attenuates between 10% and 90% of RF power outputted by said RF generator.

153. The method of 148 wherein said RF power attenuator attenuates between 20% and 80% of RF power outputted by said RF generator.

154. The method of claim 148 wherein said RF power attenuator is disposed between said first RF transmission line and said matching network.

155. The method of claim 154 wherein said matching network is coupled to said RF power attenuator.

156. The method of claim 154 wherein said first RF transmission line is coupled to said RF generator.

157. The method of claim 156 wherein said RF power arrangement further comprising a second RF transmission line having a first end and a second end, said first end being coupled to said matching network, said second end being coupled with a terminal of said RF power attenuator, another terminal of said RF power attenuator being coupled to said first RF transmission line.

158. The method of claim 148 wherein said first RF power attenuator is disposed between said RF generator and said first RF transmission line, said first RF transmission line being coupled to said matching network.

159. The method of claim 148 further comprising a chamber, wherein the RF power is inductively coupled to a plasma within said chamber.

160. The method of claim 148 further comprising a chamber, wherein the RF power is capacitively coupled to a plasma within said chamber.

161. A plasma processing system, comprising:

an RF generator having an RF generator output;

a first RF transmission line coupled to receive RF current from said RF generator output, said RF transmission line having a characteristic impedance;

a matching network having an input impedance substantially equal to said characteristic impedance of said RF transmission line, said matching network being configured to receive said RF current from said RF generator through said RF transmission line, wherein both said input impedance of said matching network and said characteristic impedance of said RE transmission line are substantially equal to a given value, said given value being designed to be lower than 50 Ω, said RF generator being configured to deliver RF power into a load having said given value.

162. The plasma processing system of claim 161 wherein said given value is between about 5 Ω and about 45Ω.

163. The plasma processing system of claim 161 wherein said given value is between about 10 Ω and about 40Ω.

164. The plasma processing system of claim 161 further comprising a chamber, said chamber being configured to generate inductively-coupled plasma.

165. The plasma processing system of claim 161 further comprising a chamber, said chamber being configured to generate capacitively-coupled plasma.

166. The plasma processing system of claim 161 wherein said given value is about 25Ω.

167. The plasma processing system of claim 166 wherein said RF transmission comprises two 50 Ω transmission lines in parallel.

168. A method for configuring a plasma processing system, said plasma processing system being configured for processing semiconductor substrates, comprising:

providing an RF generator having an RF generator output;

configuring a first RF transmission line to receive RF current from said RF generator output, said RF transmission line having a characteristic impedance;

providing a matching network having an input impedance substantially equal to said characteristic impedance of said RF transmission line, said matching network being configured to receive said RF current from said RF generator through said RF transmission line, wherein both said input impedance of said matching network and said characteristic impedance of said RF transmission line are substantially equal to a given value, said given value being designed to be lower than 50 Ω said RF generator being configured to deliver RF power into a load having said given value.

169. The method of claim 168 wherein said given value is between about 5 Ω and about 45Ω.

170. The method of claim 168 wherein said given value is between about 10 Ω and about 40Ω.

171. The method of claim 168 wherein said plasma processing system includes a chamber, said chamber being configured to generate inductively-coupled plasma.

172. The method of claim 168 wherein said plasma processing system includes a chamber, said chamber being configured to generate capacitively-coupled plasma.

173. The method of claim 168 wherein said given value is about 25Ω.

174. The method of claim 173 wherein said RF transmission comprises two 50 Ω transmission lines in parallel.

* * * * *